US007008834B2

(12) United States Patent
Nakai et al.

(10) Patent No.: US 7,008,834 B2
(45) Date of Patent: Mar. 7, 2006

(54) METHOD FOR MANUFACTURING A SEMICONDUCTOR DEVICE

(75) Inventors: Satoshi Nakai, Kawasaki (JP); Jun Sakuma, Kawasaki (JP); Mitsugu Tajima, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/844,497

(22) Filed: May 13, 2004

(65) Prior Publication Data
US 2005/0106837 A1 May 19, 2005

(30) Foreign Application Priority Data
Nov. 14, 2003 (JP) .............................. 2003-386006

(51) Int. Cl.
*H01L 21/00* (2006.01)
*H01L 21/76* (2006.01)
(52) U.S. Cl. ...................... 438/197; 438/164; 438/149; 438/424; 438/427
(58) Field of Classification Search ................ 438/197, 438/164, 149, 424, 427
See application file for complete search history.

(56) References Cited

U.S. PATENT DOCUMENTS

| | | | |
|---|---|---|---|
| 6,207,534 B1 * | 3/2001 | Chan et al. ................. | 438/427 |
| 6,498,370 B1 | 12/2002 | Kim et al. ................... | 257/347 |
| 2002/0022327 A1 * | 2/2002 | Park ............................ | 438/300 |
| 2003/0151080 A1 * | 8/2003 | Hurley et al. ................ | 257/296 |
| 2004/0092082 A1 * | 5/2004 | Terahara et al. ............ | 438/424 |
| 2004/0092115 A1 * | 5/2004 | Hsieh et al. ................. | 438/694 |

FOREIGN PATENT DOCUMENTS

JP 2001-168337 9/2001

OTHER PUBLICATIONS

"Impact of 0.10 μm SOI CMOS with Body-Tied Hybrid Trench Isolation Structure to Break Through the Scaling Crisis of Silicon Technology," pp. 467-470, Yuuichi Hirano et al., IEDM 2000.

* cited by examiner

*Primary Examiner*—Michael Trinh
(74) *Attorney, Agent, or Firm*—Westerman, Hattori, Daniels & Adrian, LLP

(57) ABSTRACT

A method for manufacturing a semiconductor device includes: forming a first photoresist pattern on a second hard mask by use of ArF; forming first and second openings in the second hard mask by use of the first photoresist pattern as an etching mask; forming third and fourth openings in a first hard mask under the first and second openings; forming a partial trench (first trench) and a trench for a full trench (second trench) in an SOI substrate (semiconductor substrate) under the first and second openings; and forming the trench for a full trench into a full trench by etching the trench for a full trench through the fourth opening exposed through a third window of a second photoresist pattern.

21 Claims, 21 Drawing Sheets

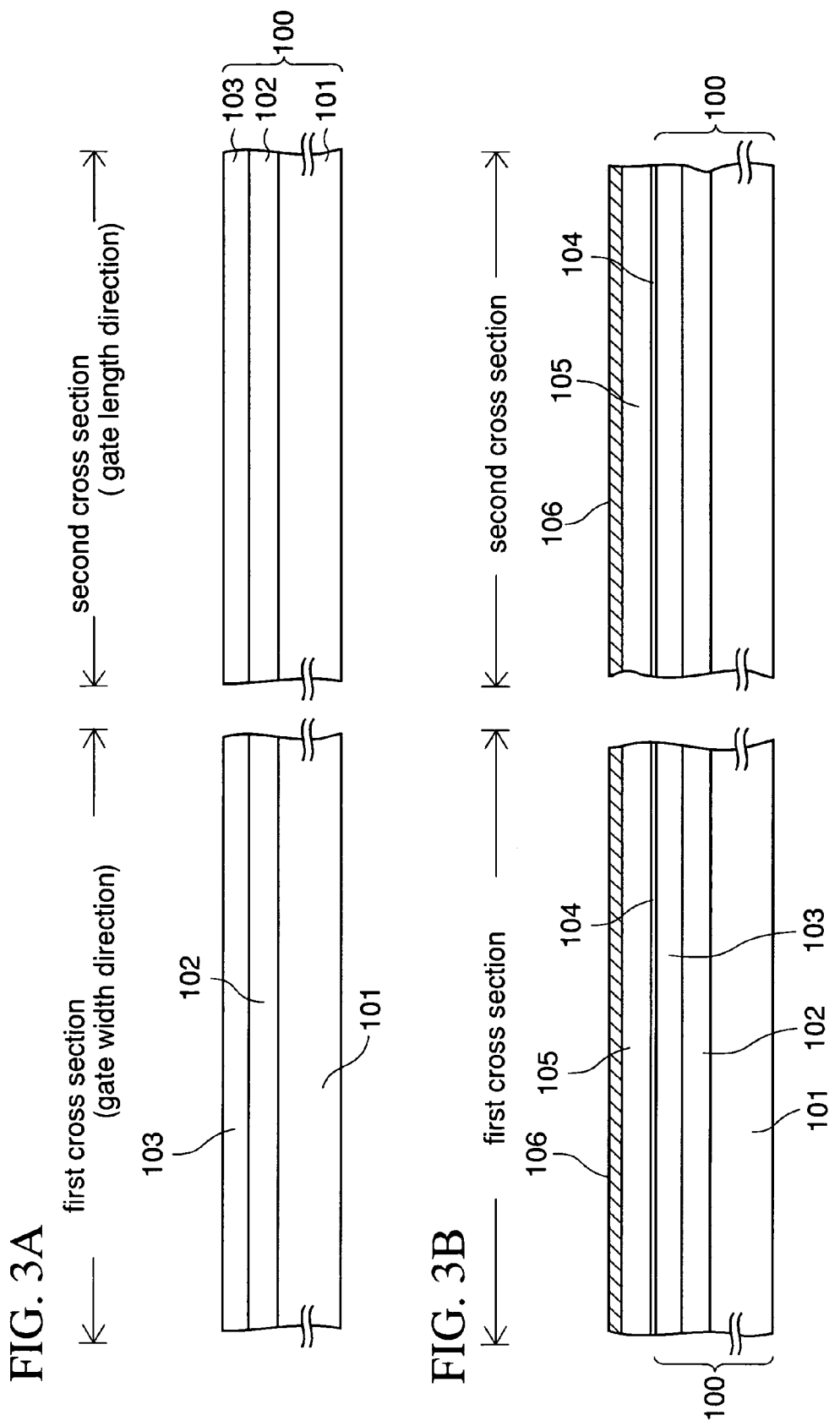

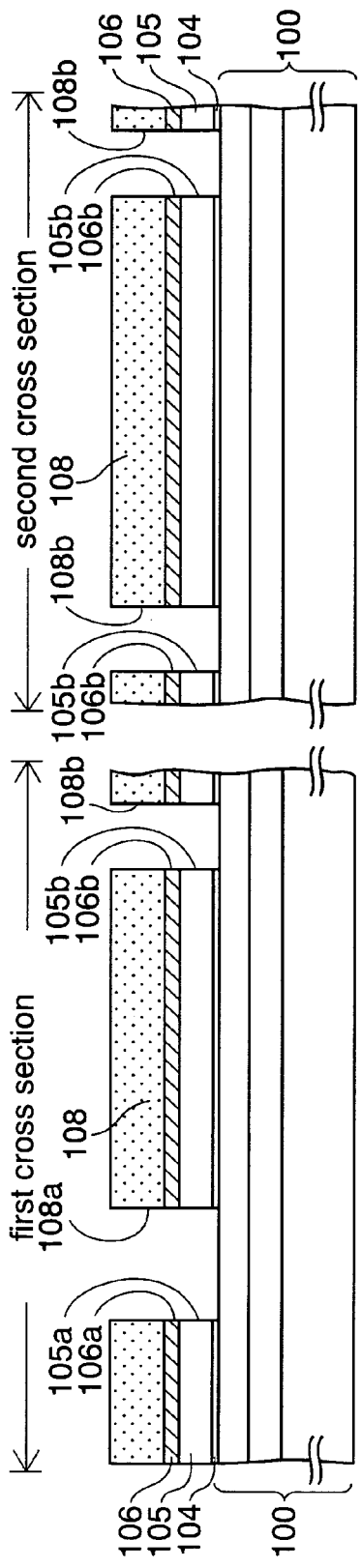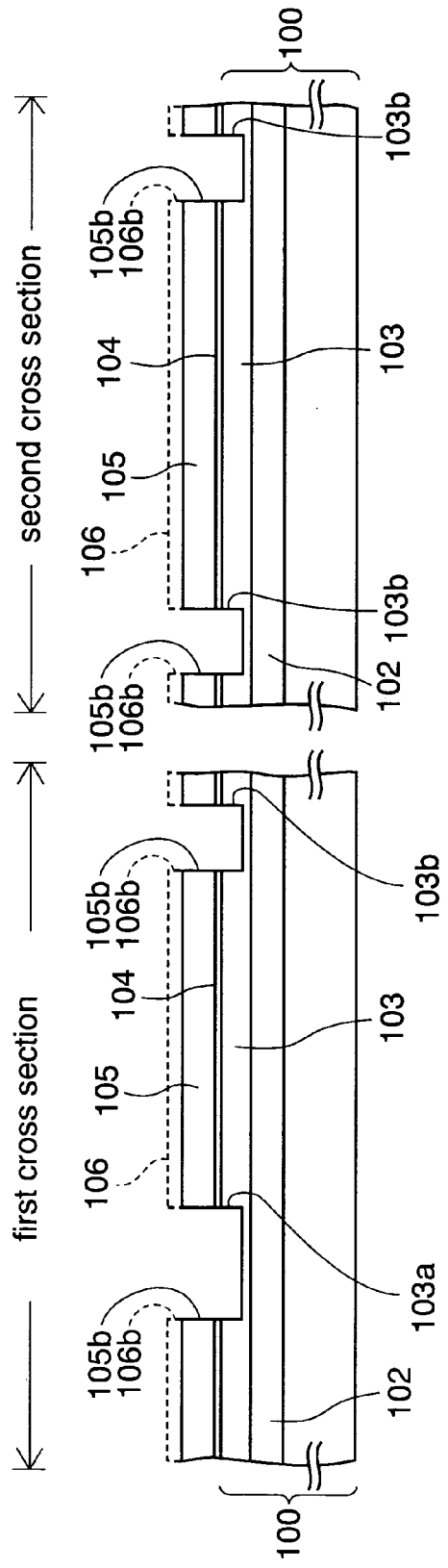

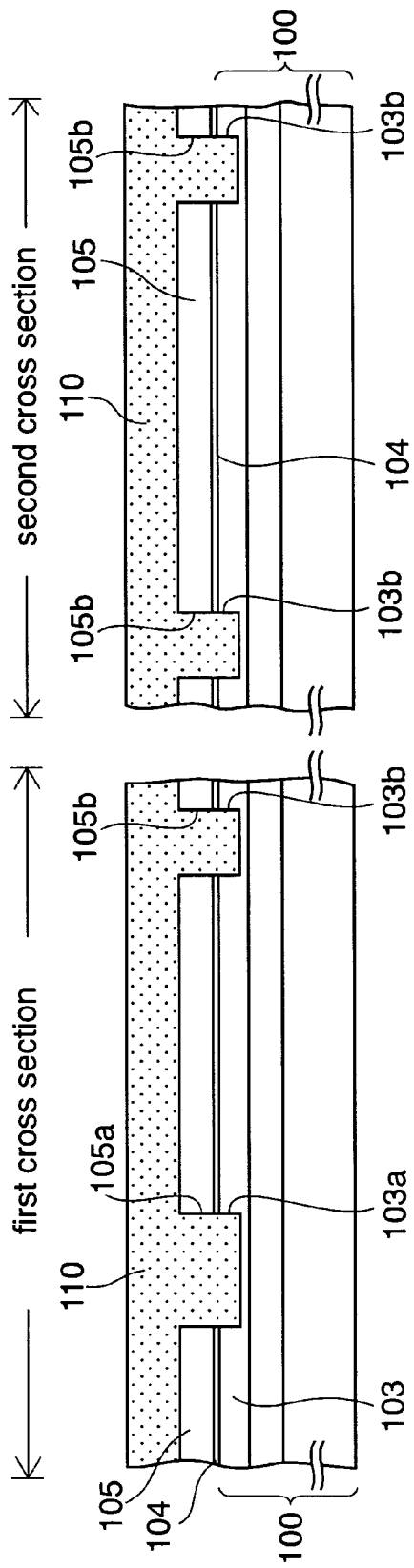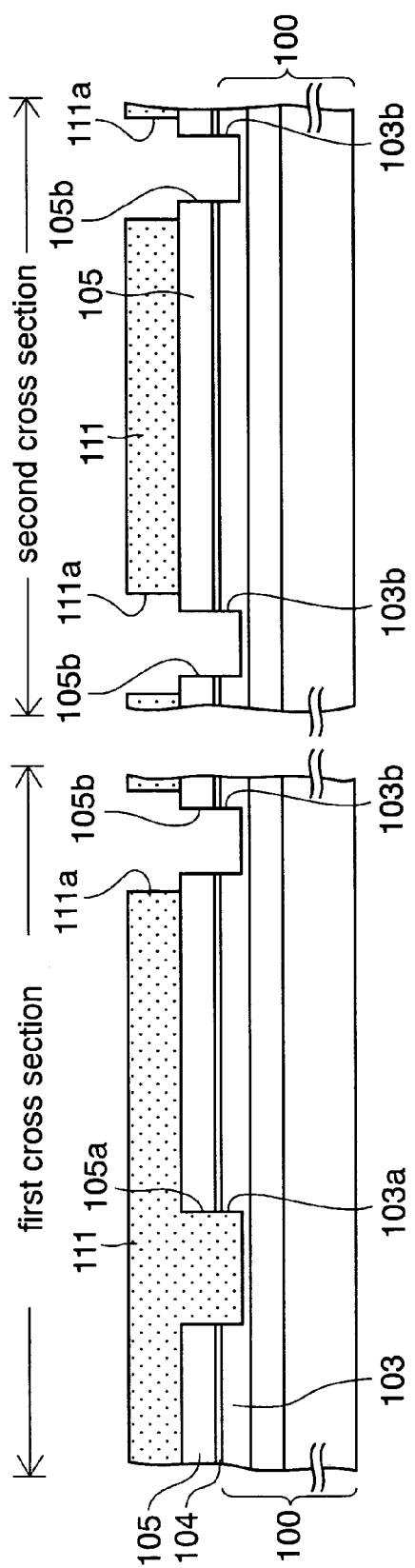

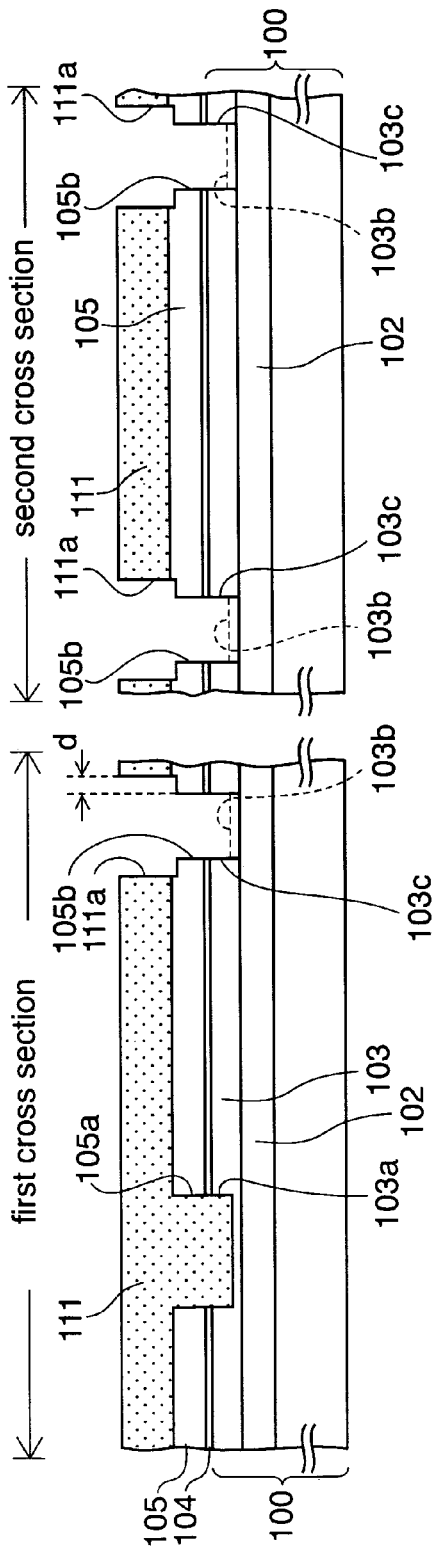
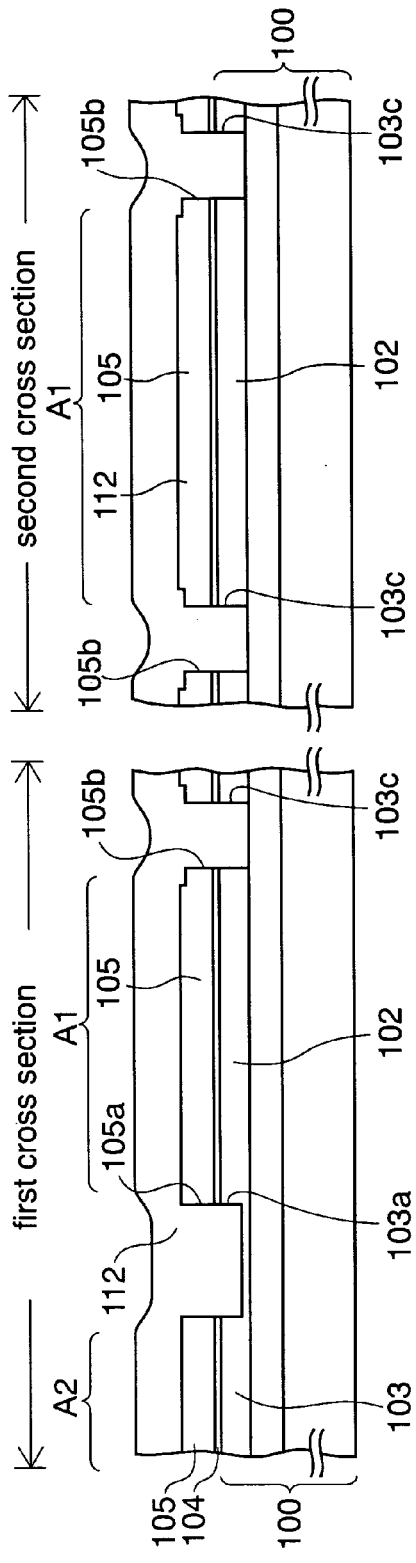
FIG. 3I
FIG. 3J

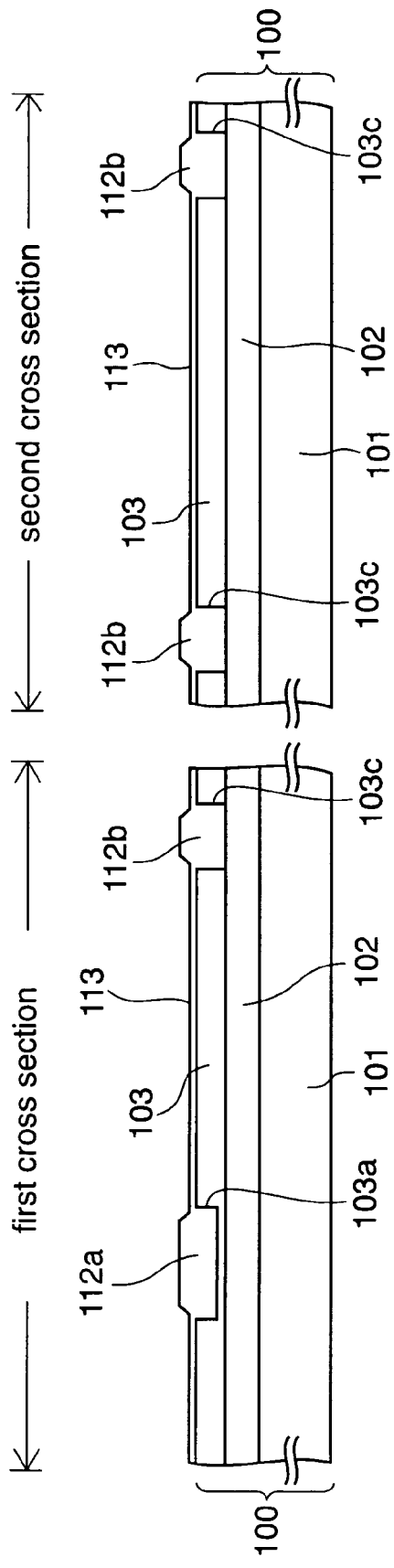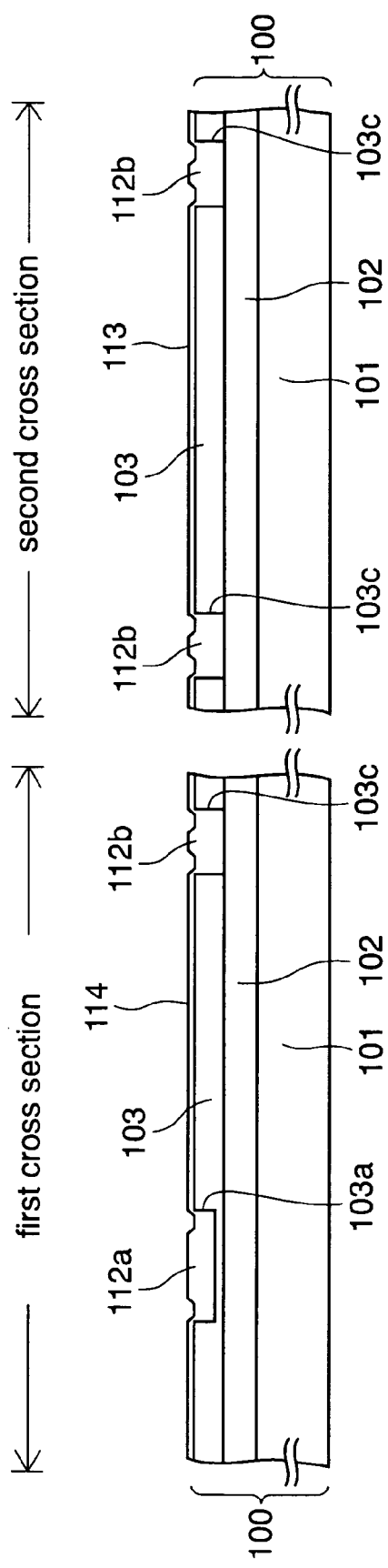

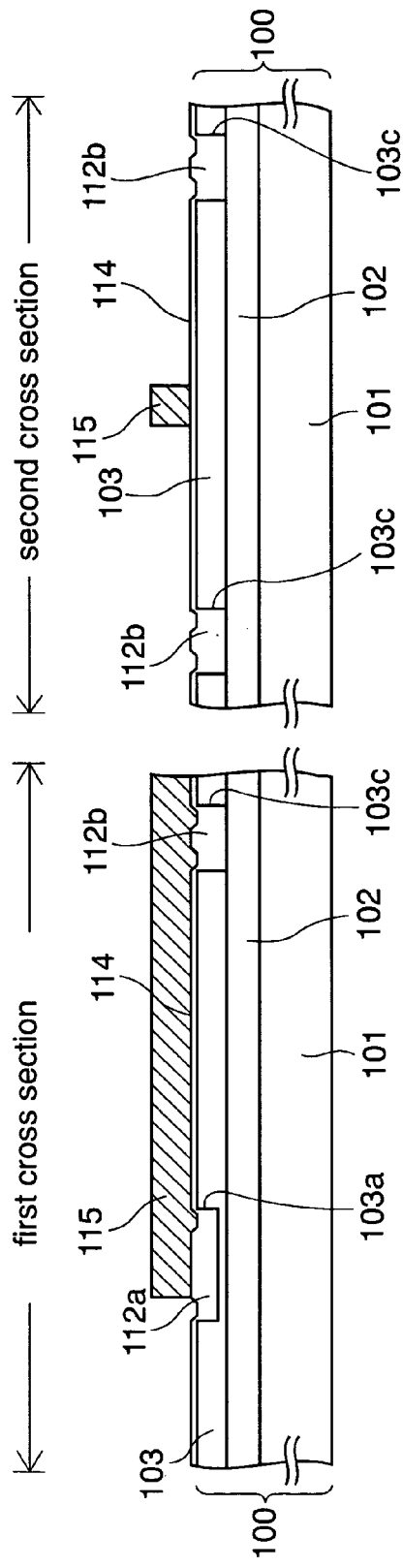
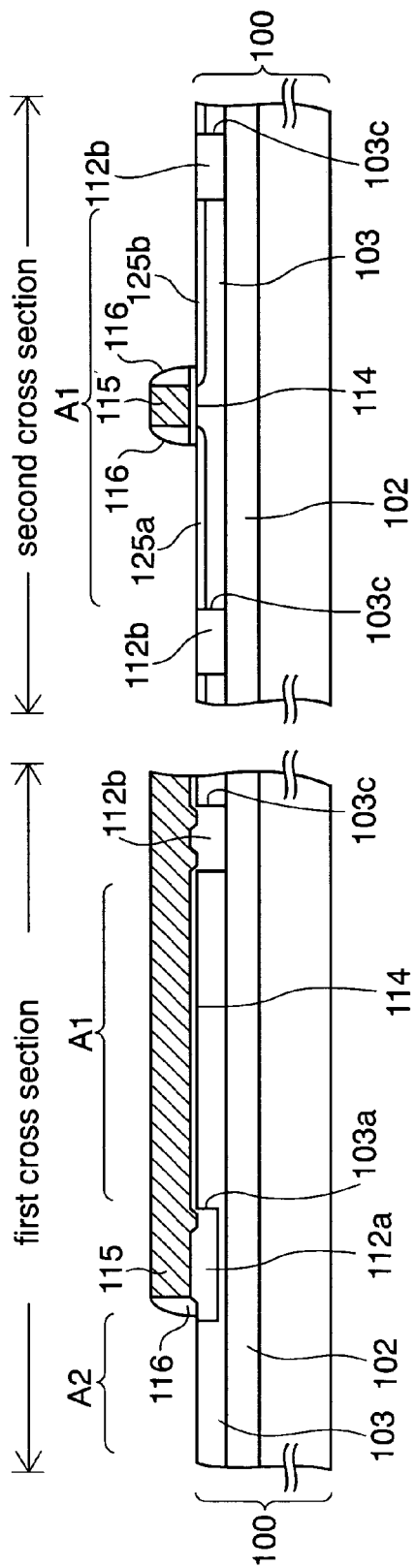

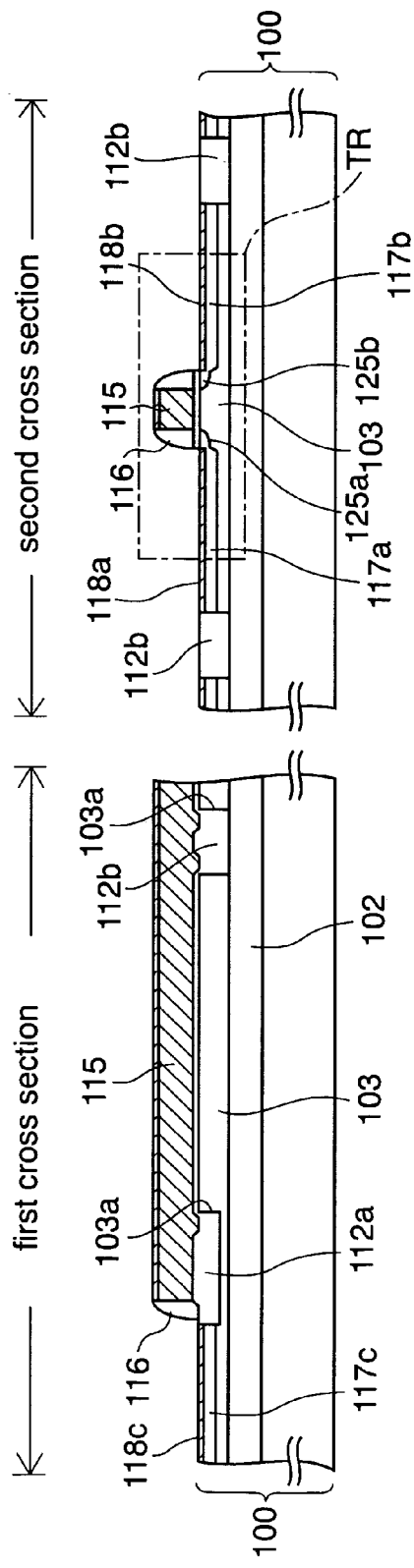
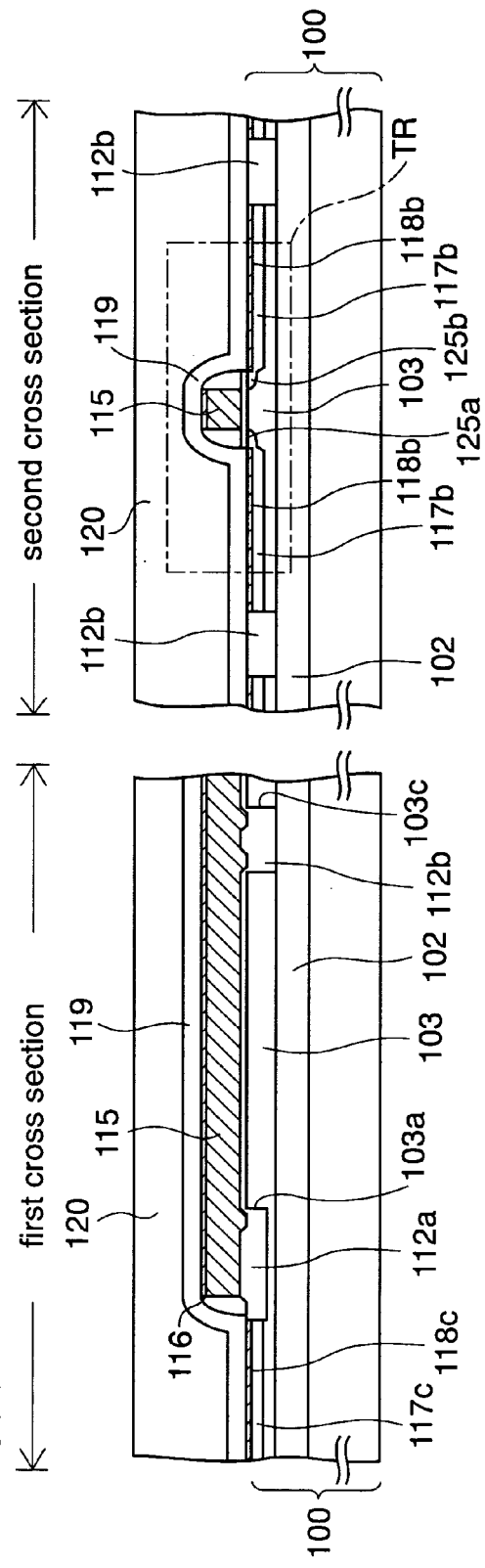
FIG. 3Q
FIG. 3R

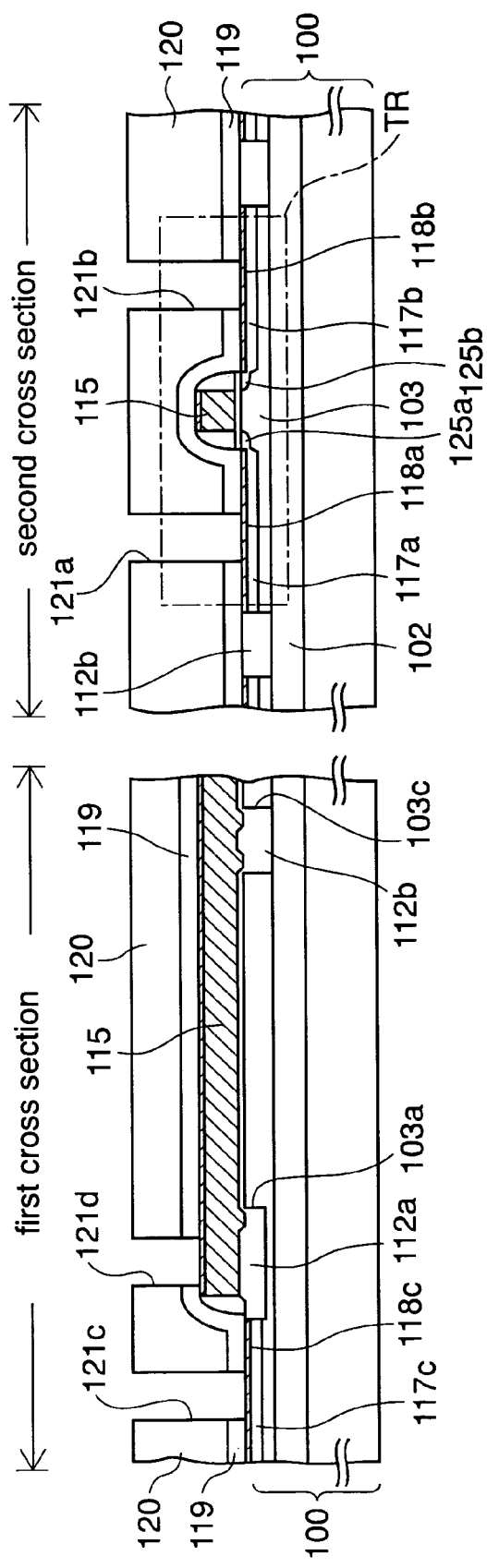

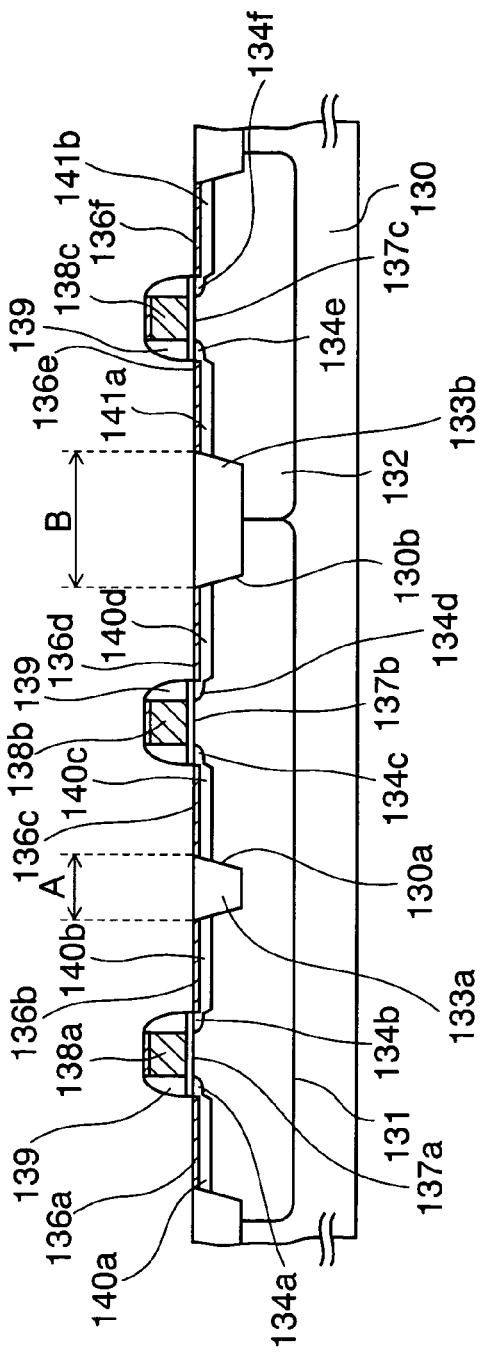

METHOD FOR MANUFACTURING A SEMICONDUCTOR DEVICE

CROSS-REFERENCE TO RELATED APPLICATIONS

This application is based on and claims priority of Japanese Patent Application No. 2003-386006 filed on Nov. 14, 2003, the entire contents of which are incorporated herein by reference.

BACKGROUND OF THE INVENTION

1. Field of the Invention

The present invention relates to a method for manufacturing a semiconductor device. More specifically, the present invention relates to a method for manufacturing a semiconductor device in which two types of trenches having different depths are formed in a semiconductor layer.

2. Description of the Related Art

Currently, semiconductor devices such as LSIs are typically fabricated by use of silicon substrates. However, in order to further improve device characteristics, the fabrication of LSIs using silicon-on-insulator (SOI) substrates is being actively researched.

An SOI substrate has a structure in which a buried insulating layer and a silicon layer are formed in order on a supporting substrate, and is fabricated by "bond and etch-back technology", "separation by implanted oxygen (SIMOX) technology", or the like. In the case where a MOS transistor is formed on the SOI substrate, a trench having a depth reaching the buried insulating layer is formed around a transistor forming region, and a device isolation insulating layer is buried in the trench. Thus, the transistor forming region is electrically isolated from the surrounding region by the device isolation insulating layer and the buried insulating layer. Accordingly, the MOS transistor (hereinafter referred to as SOI MOS transistor) shows excellent device isolation characteristics.

In addition, the SOI MOS transistor is also more excellent than MOS transistors fabricated by use of silicon substrates in terms of low power consumption, a small junction capacity, high soft error resistance and latch-up resistance.

However, if the SOI MOS transistor is completely isolated by the device isolation insulating layer and the buried insulating layer as described above, the silicon layer (body) in the region which is surrounded by these insulating layers and is served as the transistor forming region is electrically floating, and the electric charge accumulated in the body cannot find any route to escape. This would vary the characteristics of a plurality of SOI MOS transistors in the order they are operated, in response to the amount of electric charge in the bodies of the each transistor, and cause a malfunction of a circuit. The phenomenon that characteristics of SOI MOS transistors vary in accordance with their operational histories in the past as described above is called history effect. For bringing out characteristics of SOI MOS transistors to the maximum, this history effect needs to be reduced.

In order to reduce the history effect, a structure called a hybrid trench structure has been proposed. In the hybrid structure, as shown in FIG. 1 of Non-patent Literature 1, a full trench and a partial trench coexist as trenches, in which device isolation insulating layers are to be buried. The full trench has a depth reaching a buried insulating layer. On the other hand, the partial trench does not reach the buried insulating layer, and a silicon layer remains under the partial trench. This makes it possible to control the electric potential of the silicon layer, which is to be a body, and to extract the electric charge of the body, through the silicon layer under the partial trench. Accordingly, the aforementioned history effect can be reduced.

The hybrid trench structure tends to be further miniaturized in the future, and need to be formed through a process compatible with a fine design rule, e.g., by photolithography in which ArF excimer laser light is used.

In Patent Literatures 1 and 2, after a partial trench is formed by use of a photoresist pattern as a mask, a full trench is formed by use of a silicon dioxide ($SiO_2$) layer as a hard mask.

(Patent Literature 1)
Japanese Unexamined Patent Publication No. 2001-168337
(Patent Literature 2)
U.S. Pat. No. 6,498,370
(Non-patent Literature 1)
Y. Hirano et al., International electron devices meeting 2000, pp. 467–470

Incidentally, if the formation of a hard mask made of a silicon dioxide layer as in Patent Literature 1 is attempted by photolithography in which ArF excimer laser light is used, something like the following process is performed. FIGS. 1A to 1C are cross-sectional views showing steps in a manufacturing method of a semiconductor device according to a prior art. FIG. 2 is a plan view for explaining a disadvantage of the manufacturing method of the semiconductor device according to the prior art.

First, as shown in FIG. 1A, a pad oxide layer 202, a pad silicon nitride layer 203, and a hard mask 204 made of silicon dioxide are formed in this order on a silicon layer 201 of an SOI substrate. After that, a photoresist pattern 205 exposed with ArF excimer laser light is formed on the hard mask 204.

Subsequently, as shown in FIG. 1B, the layers from the hard mask 204 to the pad oxide layer 202 are sequentially etched by use of the photoresist pattern 205 as a mask, thus making the layers 202 to 204 left under the photoresist pattern 205 into a trench mask 206. Thereafter, the photoresist pattern 205 is removed.

Then, as shown in FIG. 1C, the silicon layer 201 is etched by use of the trench mask 206 as an etching mask, thus forming trenches 201a such as a full trench and a partial trench in the silicon layer 201.

However, ArF photoresist used as the photoresist pattern 205, e.g., chemically amplified positive photoresist having an alicyclic structure, has small etching selectivities to silicon dioxide and silicon nitride. This is based on the following reasons.

In general, ArF photoresist need to transmit ArF excimer laser light at a wavelength of 193 nm. Accordingly, unlike KrF photoresist, ArF photoresist cannot contain an aromatic ring, which absorbs light at wavelengths of 200 nm or shorter. Therefore, the above-described alicyclic structure is employed in ArF photoresist, but an alicyclic structure is inferior to an aromatic ring in etching resistance. Furthermore, in the case of ArF photoresist, in order to cope with miniaturization, a thin photoresist is often used compared to the case of KrF photoresist. For example, an appropriate thickness for photoresist is up to three times the line width desired to be exposed. Accordingly, when exposure is performed for a line width of 0.13 $\mu$m, a photoresist thickness becomes approximately 0.4 $\mu$m, and when exposure is performed for a line width of 0.09 $\mu$m, a photoresist thickness becomes thinner, i.e., 0.3 $\mu$m at most.

Despite such a situation, since a silicon dioxide layer and a silicon nitride layer require relatively high ion energy in etching in general, the shape of the photoresist pattern 205 is deformed by the ion energy.

Therefore, when the hard mask 204 made of silicon dioxide is etched in the step of FIG. 1B, the photoresist pattern 205 is also etched, and the thickness thereof is reduced. Thus, the shape of the photoresist pattern 205 becomes unstable. This also causes the shape of the trench mask 206, which is formed by use of the photoresist pattern 205 as an etching mask, to become unstable, and, as shown in the plan view of FIG. 2, large irregularities are formed on the edges of the trench mask 206. Accordingly, despite the use of ArF exposure suitable for miniaturization, the processing accuracies of the trenches 201a are deteriorated and, ultimately, devices cannot be miniaturized.

SUMMARY OF THE INVENTION

According to an aspect of the present invention, provided is a method for manufacturing a semiconductor device comprise: forming a first mask layer on a semiconductor layer; forming a silicon layer as a second mask layer on the first mask layer; forming a first photoresist on the second mask layer, and after exposing the first photoresist with ArF, making the first photoresist into a first photoresist pattern having a first window and a second window by developing the first photoresist; forming a first opening in the second mask layer under the first window and forming a second opening in the second mask layer under the second window, by etching the second mask layer through the first window and the second window; forming a third opening in the first mask layer under the first opening and forming a fourth opening in the first mask layer under the second opening, by etching the first mask layer through the first opening and the second opening; removing the first photoresist pattern; forming a first trench and a second trench in the semiconductor layer under the third opening and the fourth opening by etching the semiconductor layer while using the second mask layer as an etching mask; covering the first mask layer with a second photoresist pattern that covers the first trench and has a third window through which the fourth opening is exposed; and etching the second trench to a depth deeper than a depth of the first trench through the fourth opening exposed through the third window.

According to the present invention, the second mask layer is constituted by the silicon layer having a high etching selectivity to the first photoresist pattern exposed with ArF. The reason why the etching selectivity is large as described above is that, because the silicon layer can be etched at lower ion energy as compared to the etching of a silicon dioxide layer and a silicon nitride layer, damage to the ArF photoresist, which has relatively weak structure due to an alicyclic structure, is reduced while performing the etching.

As a result, when the second mask layer is etched through the first and second windows of the first photoresist pattern, the thickness of the first photoresist pattern is hard to be reduced during the etching, thus makes it possible to improve the stability of the first photoresist pattern in the etching. Therefore, since the edges of the first photoresist pattern is hard to become rough when the etching is being performed, the first and second openings can be neatly formed in the second mask layer with high processing accuracy by the etching. Accordingly, the processing accuracies of the first and second trenches formed by use of the second mask layer as an etching mask are also improved, and characteristics of ArF exposure suitable for miniaturization can be sufficiently brought out. Thus, the miniaturization of devices can be further advanced than in the case where the silicon dioxide layer is used as the second mask layer.

Moreover, the second trench is formed in self-align manner to the fourth opening of the first mask layer, and the width of the second trench becomes the same as that of the fourth opening. Accordingly, the processing accuracy of the second trench is determined by that of the fourth opening. Since the fourth opening is formed by use of the above-described second mask layer as an etching mask, the fourth opening is finely formed with high accuracy. Consequently, even if the second photoresist pattern as an etching mask for the formation of the second trench is formed by use of a light having a longer wavelength than ArF, e.g., by use of KrF, the second trench which is formed in self-align manner to the fourth opening can be finely formed with high accuracy as if exposure had been performed with ArF.

In the second photoresist pattern, the third window through which the fourth opening is exposed needs to be formed. The alignment between the third window and the fourth opening is eased by making the size of the third window larger than that of the fourth opening.

Further, by etching and removing the second mask layer simultaneously with the formation of the first trench, the need to additionally perform the step of removing the second mask layer is eliminated, thus simplifying the process.

In addition, in the case where a polysilicon layer is formed as the second mask layer, pinholes can be prevented from being formed in the second mask layer by making the thickness of the polysilicon layer thicker than 30 nm, thus making it possible to improve the processing accuracies of the first and second trenches formed by use of the second mask layer as an etching mask.

Note that, in the case where a silicon nitride layer is formed as the aforementioned first mask layer, stresses from the silicon nitride layer are absorbed in a silicon dioxide layer by forming the silicon dioxide layer, such as a thermally-oxidized film, on the semiconductor layer before the silicon nitride layer is formed, thus making it possible to prevent the semiconductor layer from being cracked due to the stresses.

BRIEF DESCRIPTION OF THE DRAWINGS

FIGS. 11 and 12 are cross-sectional views for explaining advantages obtained in the case where the present invention is applied to a silicon substrate.

DETAILED DESCRIPTION OF THE PREFERRED EMBODIMENTS

Hereinafter, best modes for carrying out the present invention will be described in detail with reference to the accompanying drawings.

(1) First Embodiment

Figure 1A:
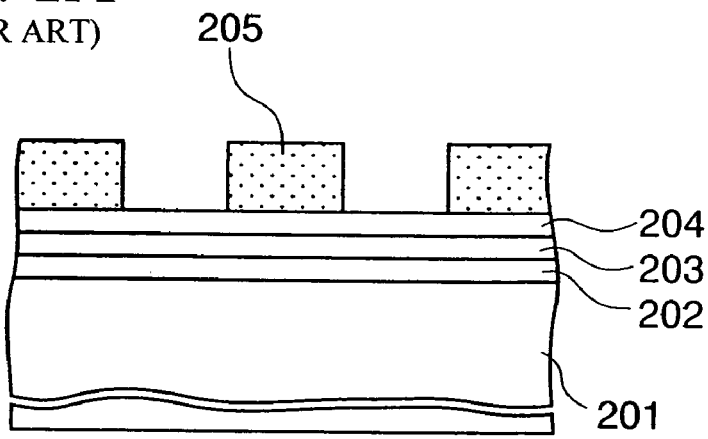
FIGS. 1A to 1C are cross-sectional views showing steps in a manufacturing method of a semiconductor device according to prior art.
Figure 1B:
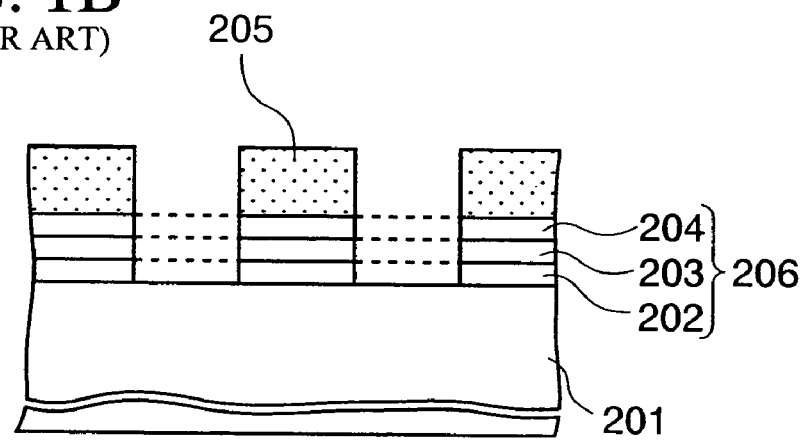
Figure 1C:
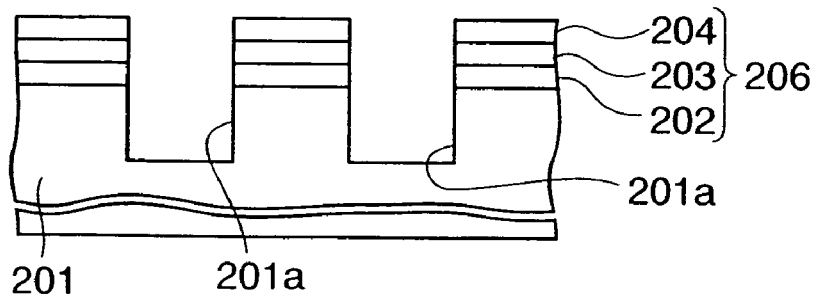
Figure 2:
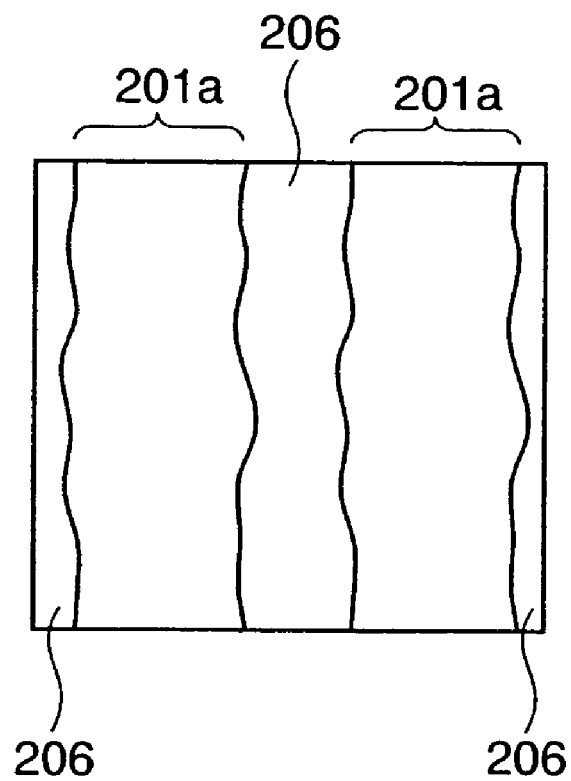
FIG. 2 is a plan view for explaining a disadvantage of the manufacturing method of the semiconductor device according to prior art.
Figure 3C:
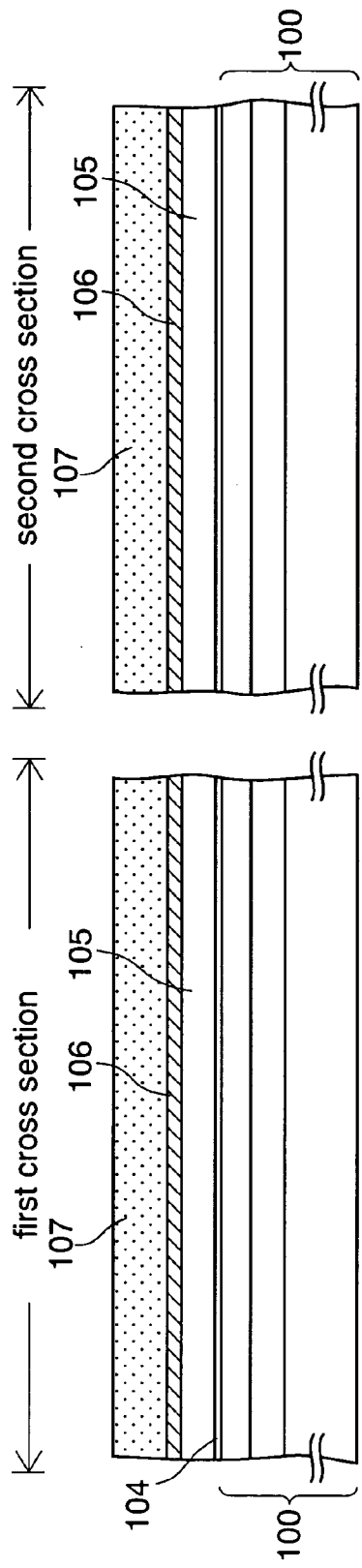
FIGS. 3A to 3T are cross-sectional views showing steps in a manufacturing method of a semiconductor device according to an first embodiment of the present invention.
Figure 3D:
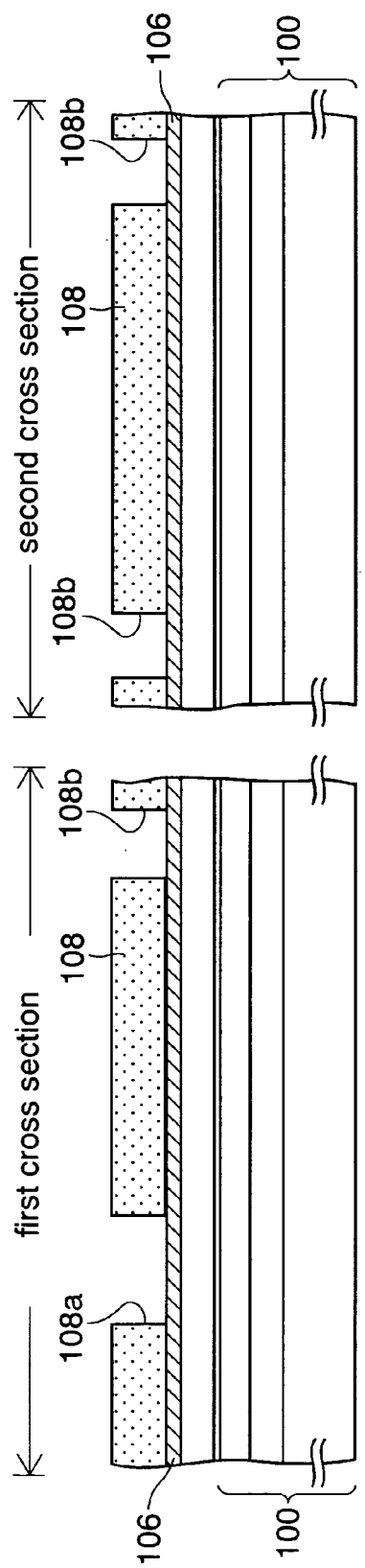
Figure 3K:
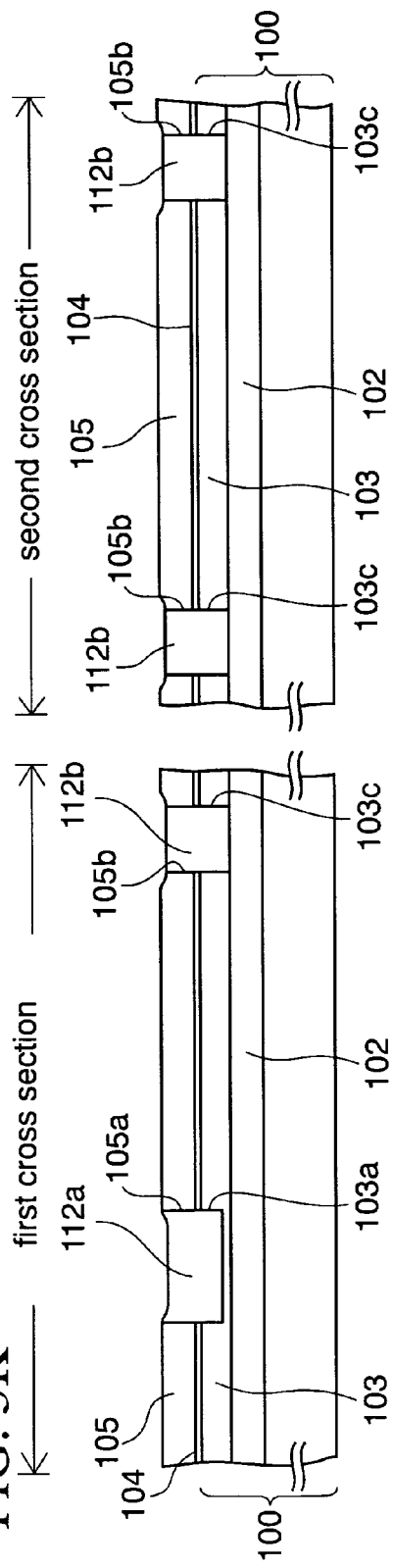
Figure 3L:
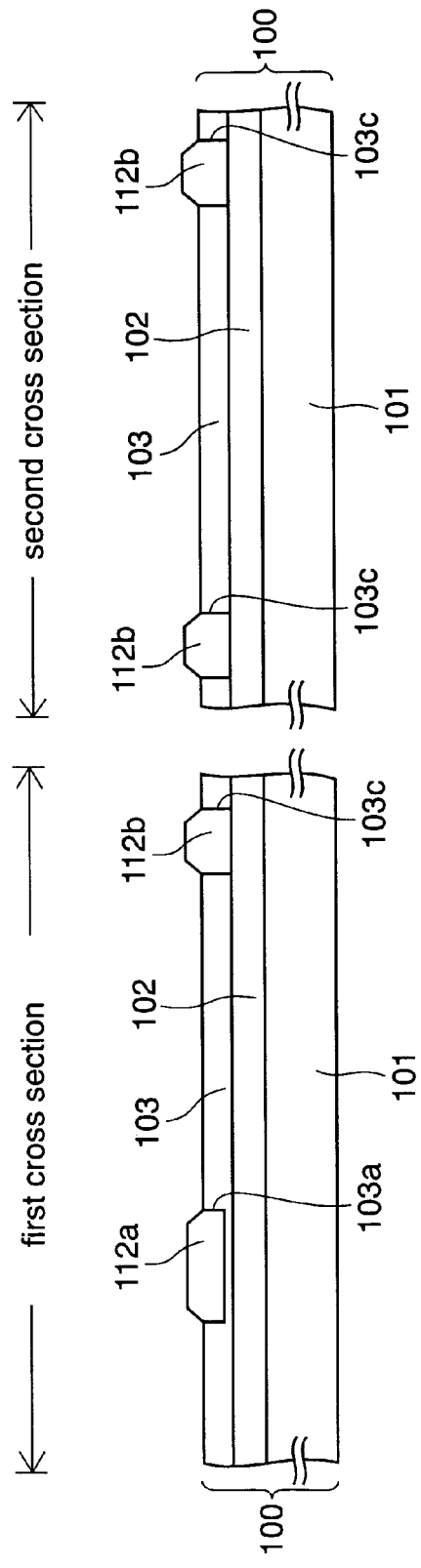
Figure 3T:
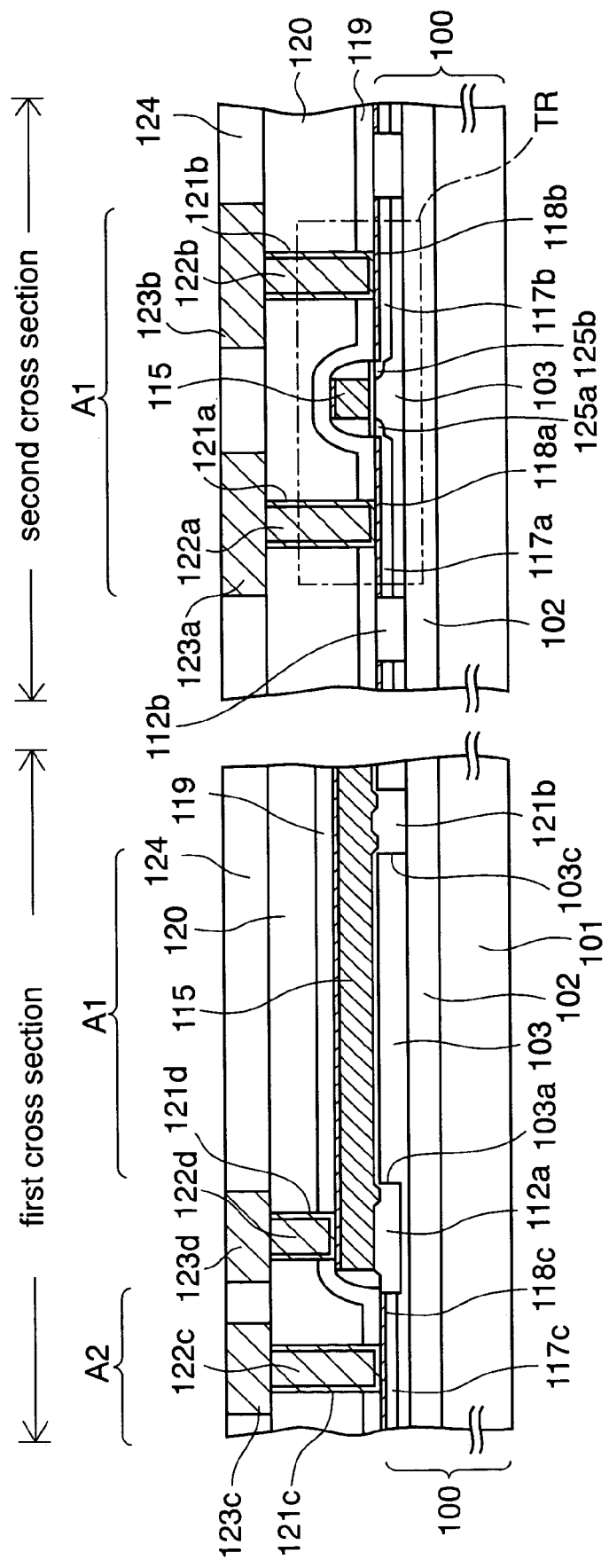

FIGS. 3A to 3T are cross-sectional views showing steps in a manufacturing method of a semiconductor device according to an embodiment of the present invention. In each of these drawings, for convenience of explanation, both of a first cross section taken along the gate width direction of a MOS transistor and a second cross section taken along the gate length thereof are shown. Moreover, the semiconductor device has a structure in which n-channel MOS transistors and p-channel MOS transistors coexist, but only the cross section of an n-channel MOS transistor is illustrated below. Furthermore, FIGS. 4 to 7, which are plan views corresponding to respective steps, are also referred to as needed.

To begin with, steps before the cross-sectional structure shown in FIG. 3A is obtained will be described.

First, a silicon substrate (not shown) having a thermally-oxidized film, which is to be a buried insulating layer 102, with a thickness of approximately 100 nm formed on the entire surface thereof is prepared. After the silicon substrate has been attached to a supporting substrate 101 made of a silicon single crystal, the supporting substrate 101 is annealed, thereby bonding the buried insulating layer 102 to the supporting substrate 101. Then, the silicon substrate (not shown) having the buried insulating layer 102 formed thereon is polished to be thinned to a thickness of approximately 60 nm, and is used as a silicon layer (semiconductor layer) 103. Thus, an SOI substrate 100 in which the buried insulating layer 102 and the silicon layer 103 are stacked in this order on the supporting substrate 101 is fabricated. Such a method of fabricating an SOI substrate is also called "bond and etch-back technology."

Instead of bond and etch-back technology, it can also be considered that an SOI substrate is fabricated by SIMOX technology. However, in SIMOX technology, since a buried insulating layer is formed by ion-implanting oxygen into a silicon substrate, the interface between a buried oxide film and a silicon layer does not clearly appear, and it is difficult to form a thin silicon layer. Accordingly, SIMOX technology is not suitable for the miniaturization of devices. Therefore, it is preferred to employ the aforementioned bond and etch-back technology for the formation of a thin silicon layer 103 having a thickness of 60 nm.

Subsequently, as shown in FIG. 3B, the surface of the silicon layer 103 is thermally oxidized, thus forming a first thermally-oxidized film 104 to a thickness of approximately 10 nm. Next, a silicon nitride (SiN) layer is formed to a thickness of 100 nm on the first thermally-oxidized film 104 by low pressure CVD in which dichlorosilane (DCS) and $NH_3$ are used as reactant gas, under conditions in which the substrate temperature is 650 to 800° C., and the silicon nitride layer is used as a first hard mask (first mask layer) 105.

Furthermore, a polysilicon layer is formed to a thickness of approximately 35 nm by low pressure CVD in which a silane-based gas, e.g., silane, is used, under conditions in which the substrate temperature is 580 to 650° C., and the polysilicon layer is used as a second hard mask (second mask layer) 106.

Note that, instead of the polysilicon layer, an amorphous silicon layer may be formed as the second hard mask 106.

In the case where a silicon nitride layer is formed as the first hard mask 105 as previously described, stresses from the first hard mask 105 are absorbed in the first thermally-oxidized film 104 by forming a silicon dioxide layer, such as the first thermally-oxidized film 104, on the SOI substrate 100 before the silicon nitride layer is formed. Thus, the silicon layer 103 of the SOI substrate 100 can be prevented from being cracked due to stresses.

Next, as shown in FIG. 3C, the SOI substrate 100 is loaded into a coater (not shown), and the second hard mask 106 is coated with chemically amplified photoresist containing alicyclic-hydrocarbon-containing polymer having a thickness of approximately 0.3 $\mu$m, as first photoresist 107 for ArF exposure, which uses a wavelength as short as 193 nm and is suitable for the miniaturization of devices. Such photoresists include acrylic resin-based photoresist, e.g., chemically amplified photoresist made of polymer or copolymer of acrylic ester having the adamantane skeleton on the ester moiety or a-substituted acrylic ester.

Next, steps before the cross-sectional structure shown in FIG. 3D is obtained will be described.

First, the SOI substrate 100 is carried to a stepper (not shown), and the first photoresist 107 is exposed by use of an ArF excimer laser. Since the first photoresist 107 is chemically amplified photoresist, acid is generated in the photoresist 107 in the region exposed by the exposure.

Thereafter, the first photoresist 107 is baked by heating the SOI substrate on a hot plate (not shown), thus accelerating the generation of acid in the first photoresist 107 in the exposed region. Such a bake is also called post exposure baking (PEB).

Subsequently, the first photoresist 107 in the exposed region where acid has been generated is removed by developing the first photoresist 107, and the first photoresist 107 in the unexposed region is left as a first photoresist pattern 108 on the second hard mask 106. The first photoresist pattern 108 has a first window 108a corresponding to a partial trench and a second window 108b corresponding to a full trench.

After that, the first photoresist pattern 108 is heated on a hot plate (not shown) to be cured while being irradiated with ultraviolet rays in order to completely cross-link the first photoresist pattern 108.

Since the first photoresist pattern 108 has been exposed by use of ArF excimer laser light at a short wavelength, the first photoresist pattern 108 can be made into a fine pattern.

Next, steps before the cross-sectional structure shown in FIG. 3E is obtained will be described.

First, the surface of the second hard mask 106 exposed through the windows 108a and 108b of the first photoresist pattern 108 is lightly etched by dry etching in which $CF_4$ is used as etching gas, thus removing a native oxide film (not shown) on the surface of the second hard mask 106.

Then, the second hard mask 106 under the windows 108a and 108b is etched by reactive ion etching (RIE) using the first photoresist pattern 108 as an etching mask, thus forming first and second openings 106a and 106b. In this RIE, a gas mixture of HBr and $O_2$ is used as etching gas, and etching conditions are as follows: the pressure is approximately 6 mTorr, the substrate temperature is approximately 60° C., and the power of high-frequency electricity at a frequency of 13.56 MHz is 350 W.

Here, the etching of polysilicon constituting the second hard mask 106 can be performed with low ion energy compared to that for a silicon dioxide layer. Therefore, even if the first photoresist pattern 108 for ArF exposure having relatively low etch resistance due to alicyclic hydrocarbon polymer is used as an etching mask, a high etching selectivity can be obtained between the first photoresist pattern 108 and the second hard mask 106. Accordingly, the thickness of the first photoresist pattern 108 is hard to reduce during etching, and the stability of the photoresist pattern 108 in etching can be improved. As a result, since the edges of the first photoresist pattern 108 is hard to become rough when etching is being performed, the first and second openings 106a and 106b, which are formed by use of the first photoresist pattern 108 as a mask, can be neatly formed with high processing accuracy.

After that, the first photoresist pattern 108 is removed by wet processing or ashing in which oxygen plasma is used.

Subsequently, the first hard mask 105 made of silicon nitride is etched by RIE by use of the second hard mask 106 as an etching mask, thereby forming third and fourth openings 105a and 105b in the first hard mask 105 under the respective openings 106a and 106b. In this RIE, a $CF_4$-based gas, e.g., a gas mixture of $CF_4$ and $CH_2F_2$; is used as etching gas, and etching conditions are as follows: the pressure is approximately 3.5 mTorr, the substrate temperature is approximately 60° C., and the power of high-frequency electricity at a frequency of 13.56 MHz is 800 W. Note that, when the first hard mask 105 is etched, the first thermally-oxidized film 104 under the openings 105a and 105b is also etched to be removed.

According to the above-described etching conditions, the etching selectivity between the second hard mask 106 and the first hard mask 105 is high. Therefore, the thickness of the second hard mask 106 cannot be reduced during etching, and the edges of the openings 105a and 105b cannot become rough.

Moreover, since the width of the third opening 105a formed by this etching becomes equal to that of the first opening 106a, the processing accuracy of the third opening 105a is determined by that of the first opening 106a. As described previously, the first opening 106a is neatly formed with high accuracy by photolithography in which ArF exposure is used. Accordingly, the processing accuracy of the third opening 105a is also improved. This is also the case for the fourth opening 105b.

Note that, though the first photoresist pattern 108 is removed before the first hard mask 105 is etched in the above, the first photoresist pattern 108 may be removed after the first hard mask 105 is etched.

Next, steps before the cross-sectional structure shown in FIG. 3F is obtained will be described.

First, in order to remove native oxide films (not shown) formed on the respective surfaces of the second hard mask 106 made of polysilicon and the silicon layer 103, the surfaces thereof are lightly etched by dry etching in which $CF_4$ is used as etching gas.

Subsequently, the SOI substrate 100 is loaded into an etching chamber (not shown), and the substrate temperature is stabilized at 60° C. Then, a gas mixture of HBr and $O_2$ is introduced as etching gas into the etching chamber, and the pressure in the chamber is adjusted to approximately 10 mTorr. Moreover, the power of high-frequency electricity at a frequency of 13.56 MHz is set to 900 W.

According to this, an etching atmosphere for silicon is provided in the chamber. Thus, the second hard mask 106 made of polysilicon is etched, and the film thickness thereof is reduced. In addition, the silicon layer 103 is etched, while the second hard mask 106 and the first hard mask 105 are functioning as an etching mask. As a result, a partial trench (first trench) 103a and a trench 103b for a full trench (second trench) are formed in the silicon layer 103 under the respective openings 105a and 105b of the first hard mask 105.

Then, when the depths of the respective trenches 103a and 103b become 40 nm, the above-described etching is stopped, and the SOI substrate is unloaded from the etching chamber.

The partial trench 103a is formed to the same width as those of the first and third openings 106a and 105a. Accordingly, the processing accuracy of the partial trench 103a is determined by the openings 106a and 105a. As described previously, the processing accuracies of the respective openings 106a and 105a are improved by forming a polysilicon layer as the second hard mask 106. Therefore, the processing accuracy of the partial trench 103a is also improved. This is also the case for the trench 103b for a full trench.

Here, if the second hard mask 106 remains on the first hard mask 105 when the etching of the trenches 103a and 103b is finished, an etching step for removing the second hard mask 106 is newly required. The bottoms of the respective trenches 103a and 103b are etched in this newly added etching step, and the trenches 103a and 103b are deepened to unintended depths, which is not preferable.

In order to prevent this, it is preferred that the second hard mask 106 be formed to a thickness less than predetermined depths of the respective trenches 103a and 103b, and that the aforementioned etching be performed so as to result in over etching for the film thickness of the second hard mask 106. This allows the second hard mask 106 to completely disappear from the upper surface of the first hard mask 105 when the etching is finished, and makes it possible to make the depths of the respective trenches 103a and 103b to be a predetermined value (40 nm).

Subsequently, as shown in FIG. 3G, the SOI substrate 100 is loaded into a coater (not shown), and the upper surface of the first hard mask 105 and the insides of the respective trenches 103a and 103b are coated with chemically amplified positive photoresist containing an aromatic ring as second photoresist 110 for KrF exposure, in which the wavelength is 248 nm and longer than that of ArF exposure. Such photoresists include polyhydroxystyrene (PHS)-based chemically amplified positive photoresist, and the film thickness thereof is made to be, for example, approximately 0.4 μm on a planar surface of the first hard mask 105.

Next, steps before the cross-sectional structure shown in FIG. 3H is obtained will be described.

First, the SOI substrate 100 is carried to a stepper (not shown), and the second photoresist 110 is exposed by use of a KrF excimer laser. Then, the SOI substrate 100 is heated on a hot plate (not shown), and PEB is performed for the second photoresist 110. Subsequently, the second photoresist 110 is developed, thereby removing exposed portions of the second photoresist 110 and leaving unexposed portions thereof as a second photoresist pattern 111 on the first hard mask 105.

After that, the second photoresist pattern 111 is heated on a hot plate (not shown) to be cured while being irradiated with ultraviolet rays.

The second photoresist pattern 111 covers the partial trench 103a and has a third window 111a through which the trench 103b for a full trench is exposed.

Subsequently, as shown in FIG. 3I, the trench 103b for a full trench is etched through the fourth opening 105b which is exposed through the third window 111a, by use of the first hard mask 105 as an etching mask, whereby the trench 103b is deepened to a depth extending to the buried insulating layer 102 and used as a full trench 103c. This etching is performed by RIE in which a gas mixture of HBr and $O_2$ is used as etching gas, and etching conditions therefor are as follows: a substrate temperature of 60° C. and a pressure of 10 mTorr are employed, and the power of high-frequency electricity at a frequency of 13.56 MHz is set to 900 W.

In this etching, the third window 111a is formed so that the fourth opening 105b may be exposed. Accordingly, the full trench 103c is formed in a self-align manner to the fourth opening 105b, and the processing accuracy of the full trench 103c is determined by the fourth opening 105b. Moreover, as already described, the fourth opening 105b is neatly formed by photolithography in which ArF excimer laser light is used, and the processing accuracy thereof is improved. Therefore, in this etching, even if the second photoresist pattern 111, which is exposed with KrF excimer laser light having a longer wavelength than ArF excimer laser light, is used, the full trench 103c can be finely formed with high accuracy as if photolithography using ArF excimer laser light was performed.

Further, the alignment between the third window 111a and the fourth opening 105b is eased by forming the third window 111a into a larger size than that of the fourth opening 105b. In the present embodiment, the distance d between a side surface of the third window 111a and a side surface of the fourth opening 105b thereunder is set to, for example, 0.10 μm.

If the third window 111a is enlarged as described above, the upper surface of the first hard mask 105 is exposed through the third window 111a when the full trench 103 is formed, and the first hard mask 105 in the exposed region is etched, whereby a step is formed on the upper surface of the first hard mask 105. However, since the etching amount of the silicon layer 103 when the full trench 103c is formed is as thin as approximately 20 to 30 nm, the step on the upper surface of the first hard mask 105 is as small as approximately several nm high. Accordingly, troubles cannot occur due to this step.

After that, the second photoresist pattern 111 is removed by wet processing or ashing in which oxygen plasma is used.

By the steps described so far, a hybrid trench structure, in which the partial trench 103a and the full trench 103c having different depths coexist, is obtained.

Figure 4:
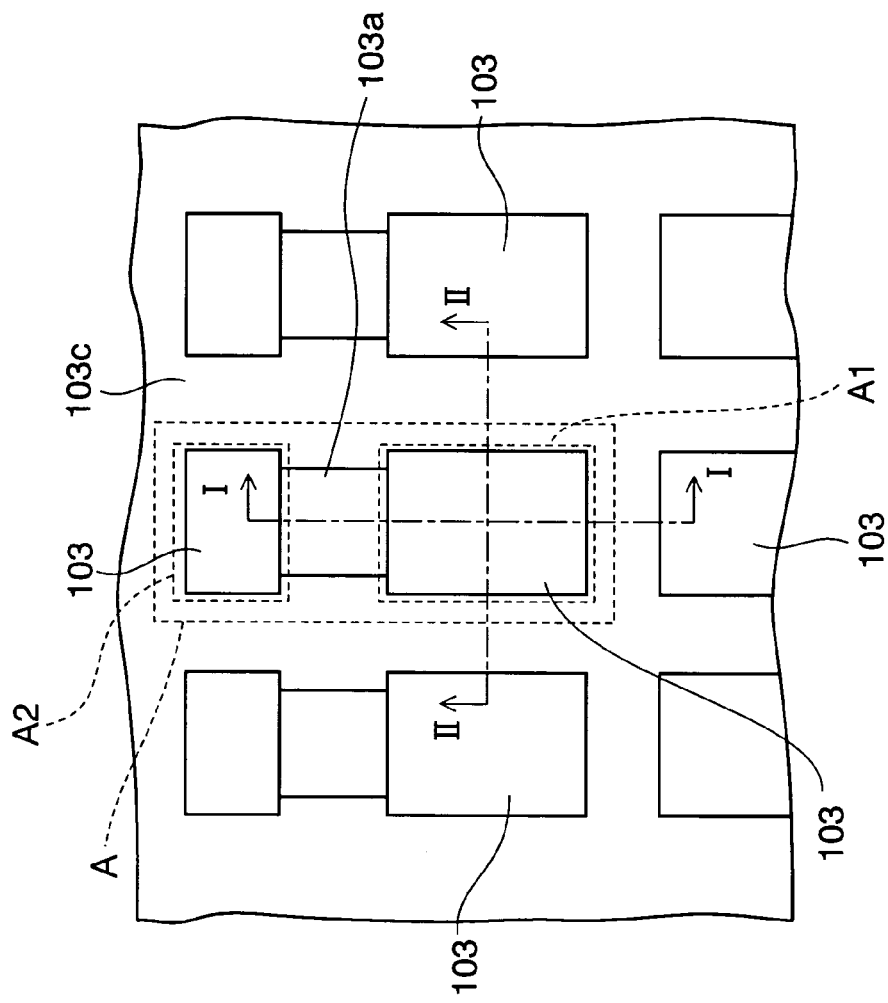
FIGS. 4 to 7 are plan views showing the manufacturing method of the semiconductor device according to the first embodiment of the present invention.

A plan view after this step has been finished, is shown in FIG. 4. The first and second cross sections of the aforementioned FIG. 3I correspond to the cross sections taken along the I—I line and the II—II line of FIG. 4, respectively. Note that the first thermally-oxidized film 104 and the first hard mask 105 are omitted in FIG. 4.

As shown in FIG. 4, the full trench 103c is formed so as to surround a transistor forming region (partial region) A of the SOI substrate. Moreover, the transistor forming region A is divided into a MOS transistor active region (first region) A1 and a well contact region (second region) A2 by the partial trench 103a.

Out of these regions, the active region A1 is the region where source/drain electrodes of a MOS transistor are formed, and the silicon layer 103 in this region A1 is called a body. On the other hand, the silicon layer 103 in the well contact region A2 is connected to the above-described body through silicon under the partial trench 103a. Accordingly, the electric charge in the body is released to an external circuit through the silicon layer 103 in the well contact region A2.

Next, steps before the cross-sectional structure shown in FIG. 3J is obtained will be described.

First, since the inner surfaces of the respective trenches 103a and 103c have been damaged in the step of etching these trenches, thermally-oxidized films (not shown) having thicknesses of approximately 5 nm are formed on the inner surfaces of the respective trenches 103a and 103c for preventing a leakage current and the like from increasing due to the damage. Subsequently, a silicon dioxide layer is formed as an insulating layer 112 on the upper surface of the first hard mask 105 and in the trenches 103a and 103c and in the openings 105a and 105b using high density plasma CVD (HDPCVD), which is excellent in filling capability. The thickness of the insulating layer 112 is made to be, for example, approximately 180 nm on the upper surface of the first hard mask 105.

Then, as shown in FIG. 3K, the insulating layer 112 is polished by chemical mechanical polishing (CMP) to be removed from the upper surface of the first hard mask 105, and the insulating layer 112 is left as first and second device isolation insulating layers 112a and 112b in the respective trenches 103a and 103c. In this CMP, the first hard mask 105 functions as a polishing stopper film.

Next, as shown in FIG. 3L, after the first hard mask 105 made of silicon nitride is etched in a phosphoric acid aqueous solution to be removed, the first thermally-oxidized film 104 is etched in a hydrofluoric acid aqueous solution to be removed, thereby exposing a clean surface of the silicon layer 103. Note that, when etching in the hydrofluoric acid aqueous solution is performed, the device isolation insulating layers 112a and 112b made of silicon dioxide are also etched, and the thicknesses thereof are thinned.

Subsequently, as shown in FIG. 3M, the surface of the silicon layer 103 is thermally oxidized again, thereby forming a second thermally-oxidized film 113 having a thickness of approximately 10 nm. After that, while using the second thermally-oxidized film 113 as a through film, p-type impurities are ion-implanted into the silicon layer 103 existing in a region for the formation of the n-channel MOS transistor, thus making the silicon layer 103 in this region into a p-well. Then, n-type impurities are ion-implanted into the silicon layer 103 existing in the region (not shown) for the formation of a p-channel MOS transistor, thus making the silicon layer 103 in this region into an n-well. Incidentally, the p-type and n-type impurities are individually implanted by use of respective photoresist patterns (not shown). Moreover, boron is used as the p-type impurities, and phosphorus is used as the n-type impurities.

Next, as shown in FIG. 3N, the second thermally-oxidized film 113 used as a through film for ion implantation is etched in a hydrofluoric acid aqueous solution to be removed, thus exposing a clean surface of the silicon layer 103 again. Then, the surface of the silicon layer 103 is thermally oxidized again to form a thermally-oxidized film having a thickness of approximately 2 nm, and the thermally-oxidized film is used as a gate insulator 114 of the MOS transistor.

Subsequently, as shown in FIG. 3O, a polysilicon layer having a thickness of approximately 100 nm is formed on the gate insulator 114 under conditions in which the substrate temperature is 580 to 650° C., using low pressure CVD in which a silane-based gas, e.g., silane, is used. Then, the polysilicon layer is patterned to be formed into a gate electrode 115.

Figure 5:
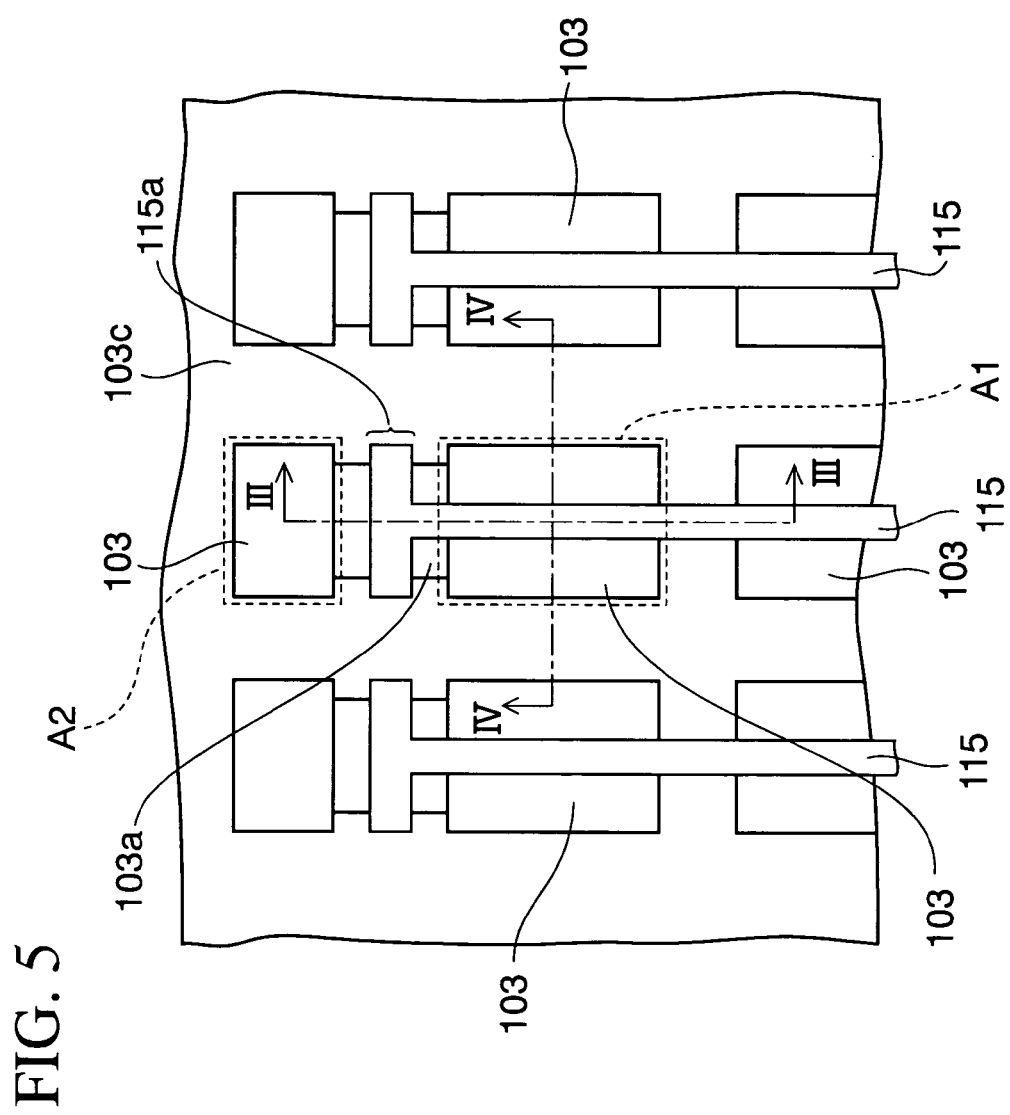

The plan view after this step has been finished, is shown in FIG. 5. The first and second cross sections of the above-described FIG. 3O correspond to the III—III and IV—IV cross sections of FIG. 5, respectively.

As shown in FIG. 5, the gate electrode 115 crosses the center of the transistor active region A1, extends to a region above the partial trench 103a, and has an expanded portion 115a expanded in the gate length direction above the partial trench 103a.

Figure 6:
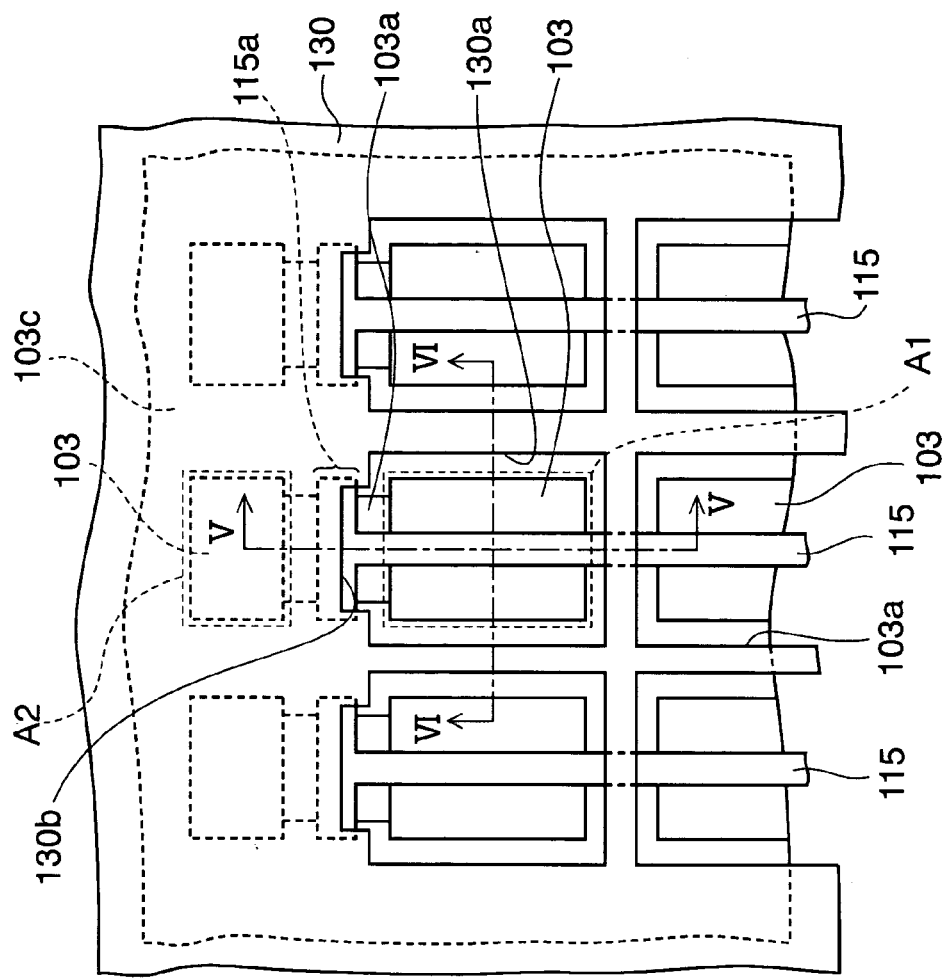
Figure 7:
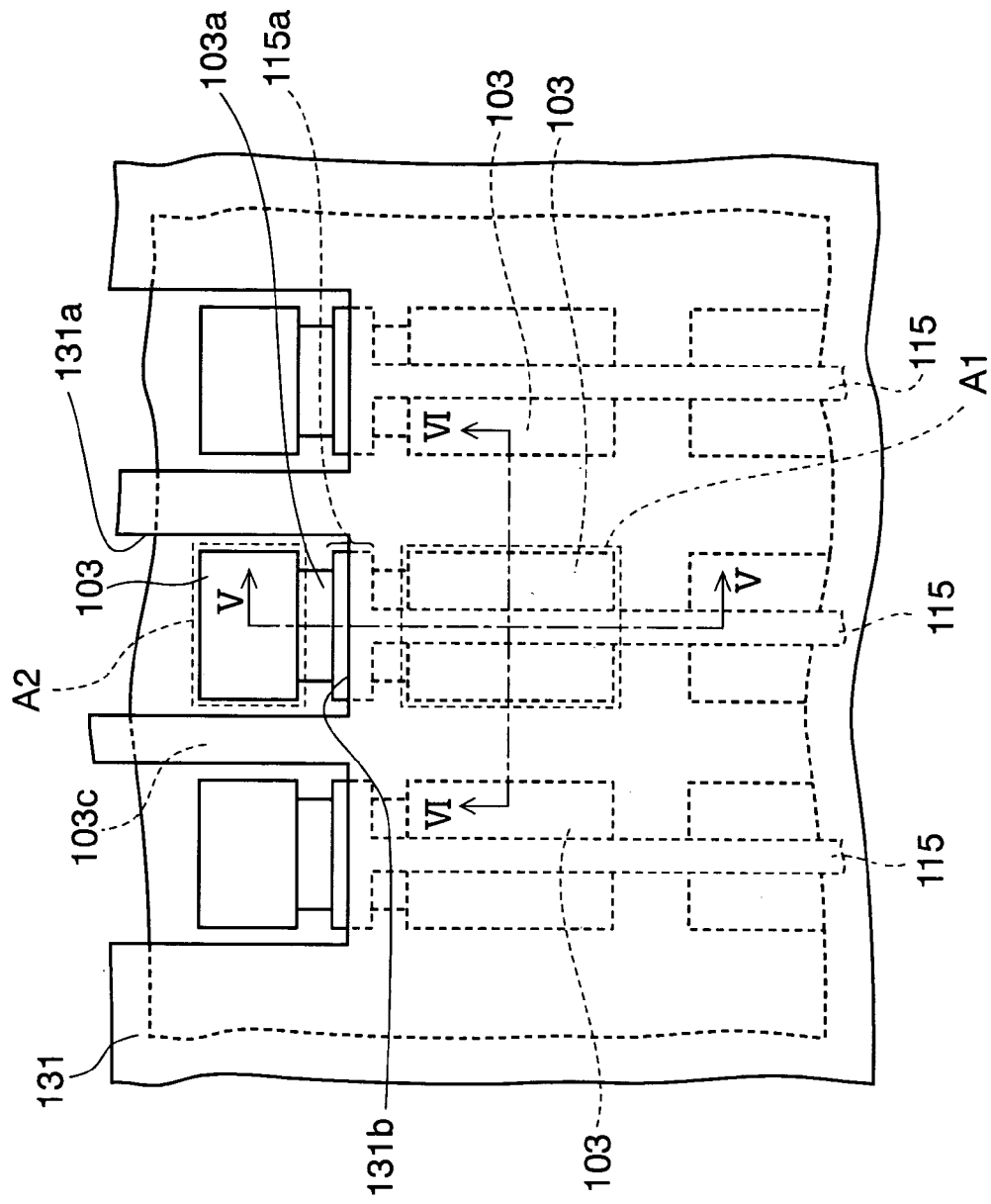

Next, steps before the cross-sectional structure shown in FIG. 3P is obtained will be described with reference to the plan views of FIGS. 6 and 7. FIGS. 6 and 7 are plan views for showing the step of FIG. 3P. The first cross section of FIG. 3P corresponds to the cross section taken along the V—V line in FIGS. 6 and 7, and the second cross section of FIG. 3P corresponds to the cross section taken along the VI—VI line in FIGS. 6 and 7.

First, as shown in the plan view of FIG. 6, a third photoresist pattern 130 having a fourth window 130a through which the transistor active region A1 is exposed and covering the well contact region A2 is formed on the entire surface. Then, arsenic is ion-implanted as n-type impurities into the active region A1 by use of the third photoresist pattern 130 as a mask.

Thus, as shown in the second cross section of FIG. 3P, source/drain extensions 125a and 125b of the MOS transistor are formed in the silicon layer 103 on both sides of the gate electrode 115. After that, the above-described third photoresist pattern 130 is removed.

Incidentally, as shown in FIG. 6, an edge 130b of the third photoresist pattern 130 has been formed so as to overlap the expanded portion 115a of the gate electrode 115. Accordingly, when the aforementioned n-type impurities are ion-implanted, the impurities are hard to be implanted into the silicon layer 103 under the partial trench 103a due to the thickness of the expanded portion 115a.

Subsequently, a silicon dioxide layer is formed on the entire surface, and the silicon dioxide layer is left on both sides of the gate electrode 115 by etch back, whereby the left silicon dioxide layer is used as a sidewall spacer 116 as shown in FIG. 3P.

Next, steps before the cross-sectional structure shown in FIG. 3Q is obtained will be described.

First, phosphorus is ion-implanted as n-type impurities into the region for the formation of the n-channel MOS transistor by use of the gate electrode 115 and the sidewall spacer 116 as a mask, thereby forming first and second n-type impurity diffusion layers (impurity regions) 117a and 117b, which are to be source/drain electrodes of the transistor.

Next, as shown in the plan view of FIG. 7, a fourth photoresist pattern 131 having a fifth window 131a through which the well contact region A2 is exposed and covering the active region A1 is formed on the entire surface. Then, boron is ion-implanted as p-type impurities into the well contact region A2 while using the fourth photoresist pattern 131 as a mask. Thus, as shown in the first cross section of FIG. 3Q, a p-type impurity diffusion layer 117c is formed in the silicon layer 103 in the well contact region A2.

Incidentally, the above-described fourth photoresist pattern 131 also functions as a mask for the formation of p-type impurity diffusion layers which are to be source/drain of a p-channel transistor (not shown). The source/drain of the p-channel transistor are formed simultaneously with the formation of the p-type impurity diffusion layer 117c.

After that, spike anneal in which the substrate temperature is raised to 1000° C. or more is performed as activation anneal for activating phosphorus in the n-type impurity diffusion layers 117a and 117b.

Subsequently, a nickel layer is formed to a thickness of approximately 3 nm on the entire surface by sputtering.

Then, silicon and nickel are reacted on the surface of the silicon layer 103 by performing anneal at a substrate temperature of 400° C. for a processing time of approximately 30 seconds, thus forming nickel silicide layers 118a to 118c on the surfaces of the respective impurity diffusion layers 117a to 117c. A nickel silicide layer is also formed on the upper surface of the gate electrode 115 to reduce the resistance of the gate electrode 115. After that, the unreacted nickel layer on the first and second device isolation insulating layers 112a and 112b which are not covered by the gate electrode 115 is removed by wet etching.

By the steps described so far, the basic structure of the MOS transistor TR constituted by the gate electrode 115 and the first and second impurity diffusion layers 117a and 117b functioning as source/drain electrodes is completed. After that, the steps of forming interlayer insulating layers and copper interconnections on the MOS transistor TR will be described.

First, as shown in FIG. 3R, a silicon nitride layer is formed to a thickness of 30 nm on the entire surface by low pressure CVD in which the substrate temperature is 650 to 800° C., and the silicon nitride layer is used as an etching stopper layer 119.

Subsequently, a silicon dioxide layer is formed as a first interlayer insulating layer 120 on the etching stopper film 119 by HDPCVD. Then, the upper surface of the first interlayer insulating layer 120 is polished and planarized by CMP, and the thickness of the first interlayer insulating layer 120 on a planar surface of the etching stopper film 119 on the SOI substrate 100 is reduced to 400 nm.

Next, steps before the cross-sectional structure shown in FIG. 3S is obtained will be described.

First, a photoresist pattern (not shown) having hole-shaped windows is formed on the first interlayer insulating layer 120. Subsequently, while using the photoresist pattern as a mask, two steps of etching, including the etching of the first interlayer insulating layer 120 and the etching of the etching stopper film 119, are performed, thereby forming first to third holes 121a to 121c on the respective impurity diffusion layers 117a to 117c and forming a fourth hole 121d on the gate electrode 115.

Incidentally, in the etching of the first interlayer insulating layer 120 made of silicon dioxide, RIE in which a $CF_4$-based gas is used as etching gas is employed, and the etching stopper film 119 made of silicon nitride functions as a stopper film in this etching. On the other hand, in the etching of the etching stopper film 119, RIE in which $CH_xF_y$ is used as etching gas is employed, and the first to third nickel silicide layers 118a to 118d and the nickel silicide layer on the gate electrode 115 function as stopper films in this etching.

Next, steps before the cross-sectional structure shown in FIG. 3T is obtained will be described.

First, a Ti layer and a TiN layer are stacked in this order as a glue layer on the inner surfaces of the first to fourth holes 121a to 121d and the upper surface of the first interlayer insulating layer 120, and a W layer is further formed thereon, thus completely filling the holes 121a to 121d. Then, the excess glue layer and W layer on the upper surface of the first interlayer insulating layer 120 are removed by CMP, and the glue layer and W layer are left only in the holes 121a to 121d. The left glue layer and W layer becomes first to fourth conductive plugs 122a to 122d in the respective holes 121a to 121d.

Subsequently, after a silicon dioxide layer is formed as a second interlayer insulating layer 124 on the upper surfaces of the respective conductive plugs 122a to 122d and the upper surface of the first interlayer insulating layer 120 by CVD, first to fourth copper interconnections 123a to 123d are formed in the second interlayer insulating layer 124 on the conductive plugs 122a to 122d through a damascene process.

Out of these copper interconnections, the first and second copper interconnections 123a and 123b are electrically connected to the first and second n-type impurity diffusion layers 117a and 117b, which are to be source/drain of the transistor, through the first and second conductive plugs 122a and 122b, respectively. The fourth copper interconnection 123d is electrically connected to the gate electrode 115 through the fourth conductive plug 122d.

On the other hand, the third copper interconnection 123c is electrically connected to the p-type impurity diffusion layer 117c through the third conductive plug 122c and the third nickel silicide layer 118c. The electric charge accumulated in the silicon layer 103 (body) in the transistor active region A1 comes to the p-type impurity diffusion layer 117c through the silicon layer 103 under the partial trench 103a and is released from the third copper interconnection 123c to the outside.

In this way, the basic structure of the semiconductor device according to the present embodiment is completed.

Figure 8:
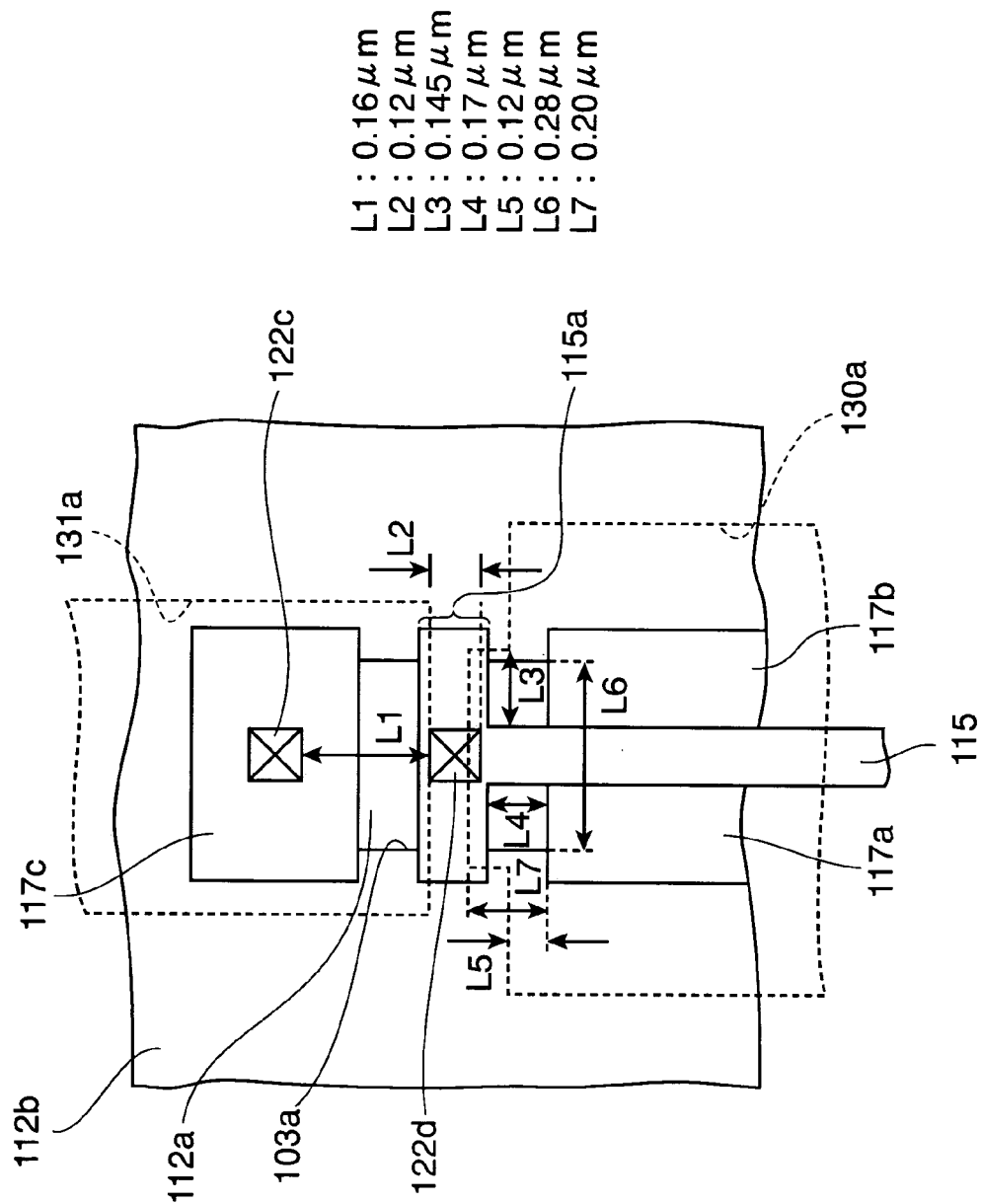
FIG. 8 is a plan view showing examples of distances between components in a planar layout of the semiconductor device according to the first embodiment of the present invention.

FIG. 8 is a plan view showing examples of distances L1 to L7 between components in a planar layout of the semiconductor device. In this drawing, the fourth window 130a of the third photoresist pattern 130 used when the n-type impurities are ion-implanted into the first and second n-type impurity diffusion layers 117a and 117b and the fifth window 131a of the fourth photoresist pattern 131 used when the p-type impurities are ion-implanted into the p-type impurity diffusion layer 117c are also shown for reference.

Note that the respective distances L1 to L7 are not limited to the values shown in this drawing but may be variously optimized.

Moreover, though only one fourth conductive plug 122d is formed on the expanded portion 115a of the gate electrode 115 in this example, a plurality of fourth conductive plugs 122d may be formed on the expanded portion 115a to lower the contact resistance between each plug 122d and the gate electrode 115.

Similarly, a plurality of third conductive plugs 121c may be formed on the p-type impurity diffusion layer 117c to lower the contact resistance between the p-type impurity diffusion layer 117c and each third conductive plug 121c.

According to the present embodiment described above, the second hard mask 106 is not made of a silicon dioxide layer like Patent Literature 1, but the second hard mask 106 is made of a polysilicon layer or an amorphous silicon layer having a high etching selectivity to the first photoresist pattern 108 for ArF exposure.

The etching of a polysilicon layer and an amorphous silicon layer can be performed at low ion energy compared to that of a silicon dioxide layer. Consequently, when the second hard mask 106 is etched in the etching step of FIG. 3E, the thickness of the first photoresist pattern 108 becomes hard to reduce during the etching, thus makes it possible to improve the stability of the first photoresist pattern 108 in etching. Since this makes the edges of the first photoresist pattern 108 hard to become rough when etching is being performed, the first and second openings 106a and 106b of the second hard mask, which are formed by use of the first photoresist pattern 108 as a mask, can be neatly formed with high processing accuracy. Accordingly, the processing accuracies of the full trench 103c and the partial trench 103a, which are formed by use of the second hard mask 106 as an etching mask, are also improved. This makes it possible to sufficiently bring out characteristics of ArF exposure, which is suitable for miniaturization, and to advance the miniaturization of devices more than the case where a silicon dioxide layer is used as the second hard mask 106.

Moreover, as shown in FIG. 3I, the full trench 103c is formed in a self-align manner to the fourth opening 105b, and the width thereof becomes the same as that of the fourth opening 105b. Accordingly, the processing accuracy of the full trench 103c is determined by that of the fourth opening 105b. Since the fourth opening 105b is formed by use of the above-described second hard mask 106 as an etching mask, the fourth opening 105b is finely formed with high accuracy. Consequently, even if the second photoresist pattern 110 is formed as an etching mask for the formation of the full trench 103c using KrF excimer laser light having a longer wavelength than ArF excimer laser light, the full trench 103c, which is formed in a self-align manner to the fourth opening 105b, can be finely formed with high accuracy as if exposure had been performed with ArF excimer laser light.

Incidentally, in the step of FIG. 3H, it can also be considered that the fine full trench 103c is formed by use of ArF photoresist instead of the second photoresist pattern 111 exposed with KrF excimer laser light. However, in order to form the fine full trench 103c with the ArF photoresist, a hard mask of a polysilicon layer need to be formed under the ArF photoresist for improving the stability of a photoresist pattern in etching. This allows the polysilicon layer to be formed in the partial trench 103a and the trench 103b for a full trench. However, since the etch rates of the polysilicon layer and the silicon layer 103 are almost the same, polysilicon formed on the bottoms of the respective trenches 103a and 103b cannot be selectively removed. According to the present embodiment, without forming such a polysilicon layer, the fine full trench 103c can be formed as if the lithography step had been performed by use of ArF excimer laser light.

Furthermore, the alignment between the third window 111a and the fourth opening 105b is eased by making the size of the third window 111a of the second photoresist pattern 111 larger than that of the fourth opening 105b of the first hard mask 105.

In addition, as shown in FIG. 3F, the second hard mask 106 is etched and removed simultaneously with the formation of the partial trench 103a. Accordingly, the step of removing the second hard mask 106 is not required, and the process is simplified.

In the case where a polysilicon layer is used as the second hard mask 106, there is the possibility that the second hard mask 106 may not function as an etching mask at the time of etching of the partial trench 103a shown in FIG. 3F if the thickness of the polysilicon layer is too thin.

Figure 9:
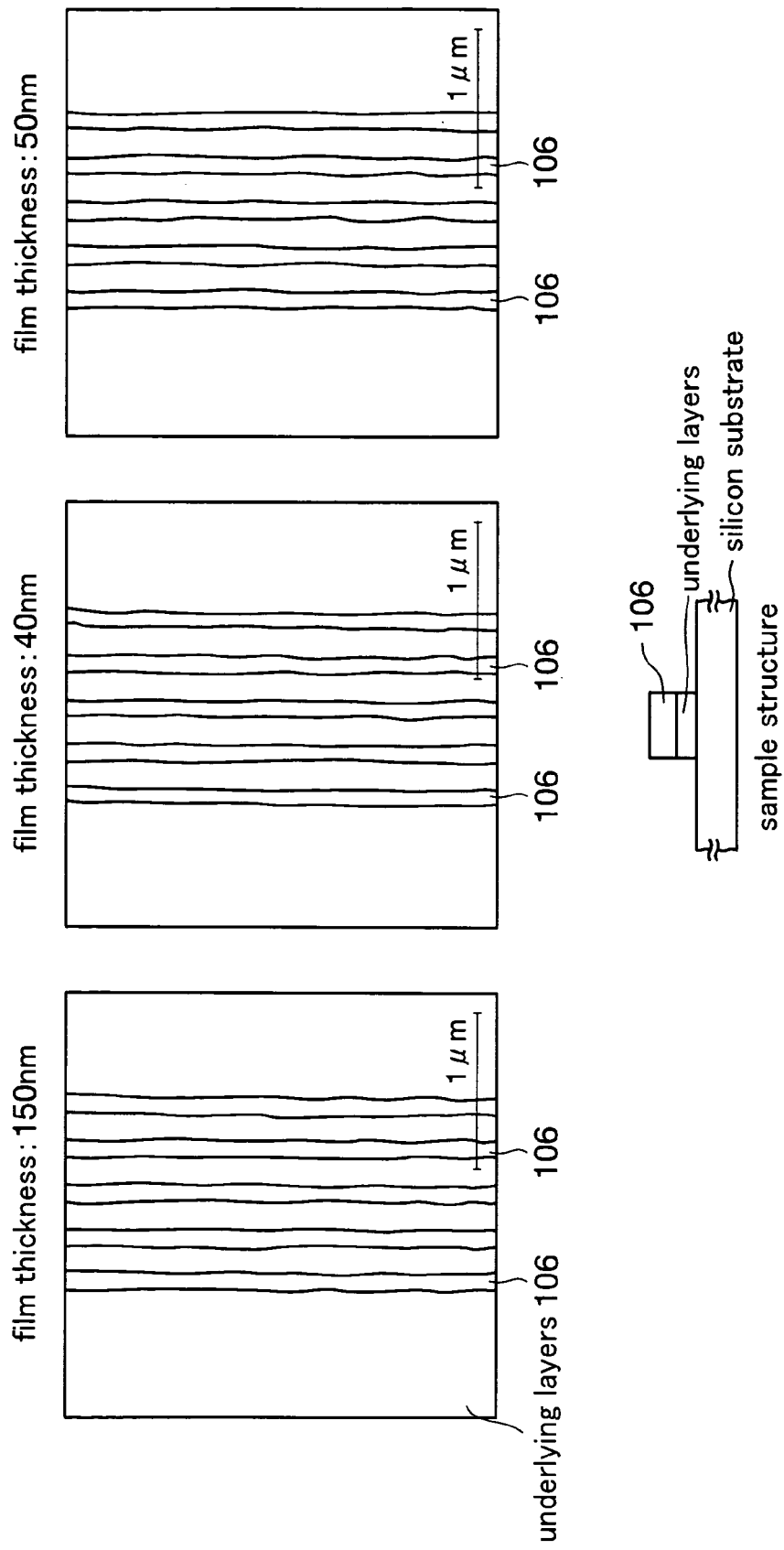
FIG. 9 contains views drawn based on planar SEM images of a second hard mask in the case where the thickness of the second hard mask made of polysilicon is changed in the range of 40 to 150 nm in the first embodiment of the present invention.
Figure 10:
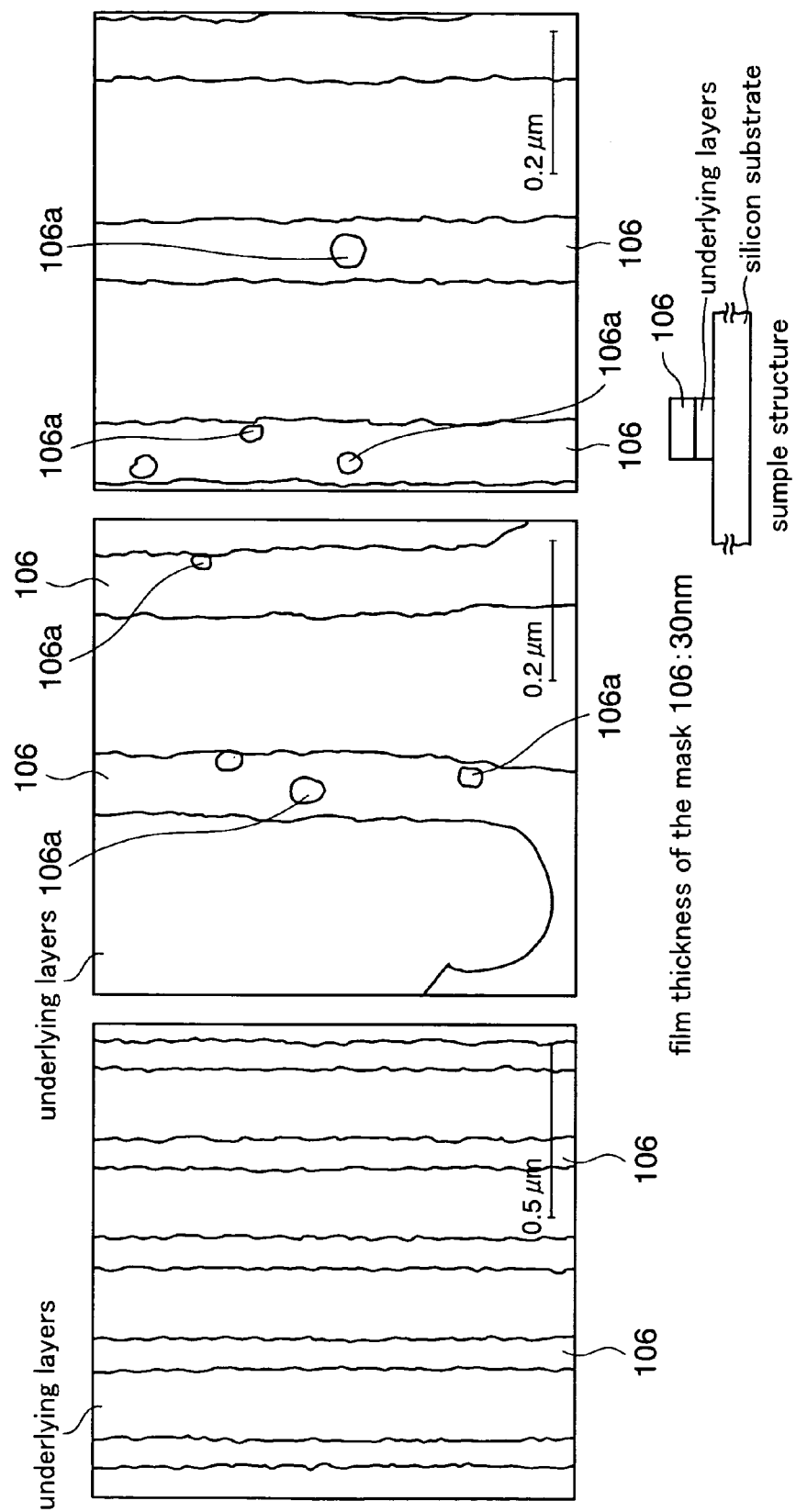
FIG. 10 is a view drawn based on a planar SEM image of the second hard mask in the case where the thickness of the second hard mask made of polysilicon is set to 30 nm in the first embodiment of the present invention.

In view of this, the inventor of the present application experimented on what change was observed in the second hard mask 106 depending on the thickness thereof while the thickness of the second hard mask 106 made of a polysilicon layer was being variously changed. The results of the experiments are shown in FIGS. 9 and 10. FIGS. 9 and 10 are views drawn based on planar images obtained by observing the second hard mask 106 with a scanning electron microscope (SEM).

In these experiments, after a thermally-oxidized film and a silicon nitride film were formed in this order as underlying layers on a silicon substrate, a polysilicon layer was formed on these underlying layers. Then, a photoresist pattern made of acrylic resin-based chemically amplified ArF photoresist was formed on this polysilicon layer, and the polysilicon layer was etched by use of this photoresist pattern as an etching mask to be formed into the second hard mask 106. Note that the photoresist pattern used as the etching mask was removed before the observation with the SEM.

As shown in FIG. 9, in the case where the thickness of the second hard mask 106 is 40 nm, 50 nm, and 150 nm, the second hard mask 106 is neatly patterned, and there is no problem even when the second hard mask 106 is used as an etching mask.

On the other hand, FIG. 10 is a view in the case where the thickness of the second hard mask 106 made of polysilicon was 30 nm. In FIG. 10, three views are drawn. Each of these is a planar image of the same sample with the SEM, and the views at the center and right are enlarged views of the view at the left.

As apparent from FIG. 10, in the case where the thickness of the second hard mask 106 is 30 nm, pinholes 106*a* are formed in the second hard mask 106, and the second hard mask 106 cannot be used as an etching mask. Note that the pinholes 106*a* exist immediately after the polysilicon layer has been formed but are not ones generated when the polysilicon layer is patterned to be formed into the second hard mask 106.

From the above-described results, it can be seen that the film thickness of polysilicon need to be thicker than 30 nm in the case where a polysilicon layer is formed as the second hard mask 106. This makes it possible to improve the processing accuracies of the full trench 103*c* and the partial trench 103*a* formed by use of the second hard mask 106 as an etching mask.

(2) Second Embodiment

In the first embodiment already described, the partial trench 103*a* and the full trench 103*c* is formed as two types of trenches having different depths in the SOI substrate 100. However, the present invention is not limited to this. As described below, two types of trenches having different depths may be formed in a silicon substrate by applying the method of the first embodiment to the silicon substrate instead of the SOI substrate. Hereinafter, advantages obtained in this case will be described.

FIG. 11 is a cross-sectional view in the case where p-channel MOS transistors and n-channel MOS transistors are formed on a silicon substrate 130 through a general CMOS process without adopting the first embodiment.

In order to obtain this cross-sectional structure, to begin with, first and second trenches 130*a* and 130*b* for shallow trench isolation (STI) are simultaneously formed to the same depth in the p-type silicon substrate 130. After that, the trenches 130*a* and 130*b* are filled with first and second device isolation insulating layers 133*a* and 133*b* made of silicon dioxide. Subsequently, p-type impurities, such as boron, are ion-implanted into a region for the formation of n-channel MOS transistors in the silicon substrate 130 to form a p-well 131. Next, n-type impurities, such as phosphorus, are ion-implanted into a region for the formation of a p-channel MOS transistor in the silicon substrate 130 to form an n-well 132.

Thereafter, the surface of the silicon substrate 130 is thermally oxidized to form a silicon oxide film, and the silicon oxide film is used as first to third gate insulator 137*a* to 137*c*.

Next, a polysilicon layer is formed on the entire upper surface of the silicon substrate 130, and the polysilicon layer is patterned into a predetermined shape, thus forming first to third gate electrodes 138*a* to 138*c* on the respective gate insulator 137*a* to 137*c*.

Subsequently, n-type impurities are ion-implanted into the p-well 131 on both sides of the first and second gate electrodes 138*a* and 138*b*, thus forming source/drain extensions 134*a* to 134*d* of the n-channel MOS transistors. Then, p-type impurities are ion-implanted into the n-well 132 on both sides of the third gate electrode 138*c*, thus forming source/drain extensions 134*e* and 134*f* of the p-channel MOS transistor.

Furthermore, an insulating layer made of silicon dioxide or the like is formed on the entire surface of the silicon substrate 130. After that, the insulating layer is left as a sidewall spacer 139 on both sides of each of the gate electrodes 138*a* to 138*c* by etch back.

Next, n-type impurities are ion-implanted into the p-well 131 by use of the first and second gate electrodes 138*a* and 138*b* and the sidewall spacers 139 as a mask, thereby forming first to fourth n-type impurity diffusion regions 140*a* to 140*d*, which are to be source/drain of the n-channel MOS transistors. Further, p-type impurities are ion-implanted into the n-well 132 by use of the third gate electrode 138*c* and the sidewall spacer 139 as a mask, thereby forming first and second p-type impurity diffusion regions 141*a* and 141*b*, which are to be source/drain of the p-channel MOS transistor.

After that, a cobalt layer is formed on the entire surface, and then cobalt silicide layers 136*a* to 136*f* are formed on the surfaces of the respective impurity diffusion regions 140*a* to 140*d* and 141*a* and 141*b* by heating the cobalt layer. Thereafter, the unreacted cobalt layers are removed by wet etching.

In the above-described structure, as the width A of the first trench 130*a*, the minimum dimension, which can be achieved in the lithography step and the subsequent etching step, is employed.

In contrast, as the width B of the second trench 130*b*, a dimension, which can ensure adequate breakdown voltage between the fourth n-type impurity diffusion layer 140*d* and the n-well 132 and adequate breakdown voltage between the first p-type impurity diffusion layer 141*a* and the p-well 131, is employed. The width B is typically set to a value twice or more as wide as the width A.

On the other hand, FIG. 12 is a cross-sectional view in the case where the second trench 130*b* is made deeper than the first trench 130*a* by adopting the first embodiment of the present invention already described. Note that the same components as those of FIG. 11 are denoted by the same reference numerals as those of FIG. 11 and will not be further described below.

In FIG. 12, the second trench 130*b* is formed deeper than that of FIG. 11. Accordingly, even if the width of the second trench 130*b* is narrowed from B to C, it is possible to ensure adequate breakdown voltage between the fourth n-type impurity diffusion layer 140*d* and the n-well 132, as well as adequate breakdown voltage between the first p-type impurity diffusion layer 141*a* and the p-well 131.

However, stricter conditions relating to the above-described breakdown voltages are imposed on the second trench 130*b* than on the first trench 130*a*. In addition, since the depth of the second trench 130b is deeper than that of the first trench 130a, the workability, the filling capability of the second device isolating insulating layer 133b, and the like are apt to deteriorate in the second trench 130b. Therefore, the width C needs to be set wider than the width A of the first trench 130a. As a result, the relation A<C<B is required.

As described above, the second trench 130b between different wells (between the p-well 131 and the n-well 132) is made deeper than the first trench 130a in a single well (the p-well 131) by applying the first embodiment of the present invention to the silicon substrate 130, whereby the distance B between the p-well 131 and the n-well 132 can be shortened like C.

What is claimed is:

1. A method for manufacturing a semiconductor device comprising:
   forming a first mask layer over a semiconductor layer;
   forming a silicon layer as a second mask layer over the first mask layer;
   forming a first photoresist over the second mask layer, and after exposing the first photoresist with ArF, making the first photoresist into a first photoresist pattern having a first window and a second window by developing the first photoresist;
   forming a first opening in the second mask layer under the first window and forming a second opening in the second mask layer under the second window, by etching the second mask layer through the first window and the second window;
   forming a third opening in the first mask layer under the first opening and forming a fourth opening in the first mask layer under the second opening, by etching the first mask layer through the first opening and the second opening;
   removing the first photoresist pattern;
   forming a first trench and a second trench in the semiconductor layer under the third opening and the fourth opening by etching the semiconductor layer while using the second mask layer as an etching mask;
   covering the first mask layer with a second photoresist pattern that covers the first trench and has a third window through which the fourth opening is exposed; and
   etching the second trench to a depth deeper than a depth of the first trench through the fourth opening exposed through the third window.

2. The method for manufacturing a semiconductor device according to claim 1, further comprising:
   forming a device isolation insulating layer in each of the first trench and the second trench.

3. The method for manufacturing a semiconductor device according to claim 2, wherein the step of forming the device isolation insulating layer comprises:
   forming an insulating layer in the first trench and the second trench and over the first mask layer; and
   leaving the insulating layer in each of the first trench and the second trench to form the device isolation insulating layer, by polishing the insulating layer to remove the same on the first mask layer.

4. The method for manufacturing a semiconductor device according to claim 1, wherein a size of the third window of the second photoresist pattern is made larger than a size of the fourth opening of the first mask layer.

5. The method for manufacturing a semiconductor device according to claim 1, wherein in the step of forming the first trench, the first mask layer is etched to be removed.

6. The method for manufacturing a semiconductor device according to claim 1, wherein one of a polysilicon layer and an amorphous silicon layer is formed as the silicon layer.

7. The method for manufacturing a semiconductor device according to claim 1, wherein a polysilicon layer having a thickness thicker than 30 nm is formed as the silicon layer.

8. The method for manufacturing a semiconductor device according to claim 1, wherein a chemically amplified positive photoresist containing alicyclic-hydrocarbon-containing polymer is used as the first photoresist.

9. The method for manufacturing a semiconductor device according to claim 1, wherein the step of forming the first opening and the second opening in the second mask layer is performed by plasma etching in which a gas mixture of HBr and $O_2$ is used as an etching gas.

10. The method for manufacturing a semiconductor device according to claim 1, wherein a silicon nitride layer is formed as the first mask layer.

11. The method for manufacturing a semiconductor device according to claim 10, wherein a silicon oxide layer is formed over the semiconductor layer before forming the silicon nitride layer.

12. The method for manufacturing a semiconductor device according to claim 1, wherein the step of covering the first mask layer with the second photoresist pattern comprises:
    coating a second photoresist in the first trench and the second trench and over the first mask layer;
    exposing the second photoresist with a light having a longer wavelength than ArF; and
    making the second photoresist after exposure into the second photoresist pattern by developing the second photoresist.

13. The method for manufacturing a semiconductor device according to claim 12, wherein KrF is used as the light having the longer wavelength than ArF.

14. The method for manufacturing a semiconductor device according to claim 13, wherein a chemically amplified positive photoresist containing an aromatic ring is used as the second photoresist that is to be exposed with the KrF.

15. The method for manufacturing a semiconductor device according to claim 1, wherein a silicon layer of an SOI substrate is used as the semiconductor layer, wherein in the step of forming the first trench, the first trench is formed shallower than the thickness of the silicon layer of the SOI substrate, and wherein in the step of etching the second trench to the depth deeper than the depth of the first trench, the second trench is etched to a depth reaching to a buried insulating layer of the SOI substrate.

16. The method for manufacturing a semiconductor device according to claim 15, wherein a partial region of the SOI substrate is surrounded by the second trench, and the partial region is divided into a first region and a second region by the first trench.

17. The method for manufacturing a semiconductor device according to claim 16, further comprising:
    forming a device isolation insulating layer in each of the first trench and the second trench;
    forming a gate electrode of a transistor over the silicon layer in the first region with a gate insulator interposed therebetween after forming the device isolation insulating layer; and
    forming a first impurity region and a second impurity region, which are to be source/drain of the transistor, by introducing impurities into the silicon layer on both sides of the gate electrode.

18. The method for manufacturing a semiconductor device according to claim 17, further comprising:
    forming an insulating layer covering the first and second regions after forming the first and second impurity regions;
    forming a first, a second, and a third holes in the insulating layer over the first and second impurity regions and the second region respectively; and
    forming a first, a second, and a third conductive plugs in the first, second, and third holes respectively.

19. A method for manufacturing a semiconductor device comprising:
    forming a first mask layer over a semiconductor layer;
    forming a second mask layer over the first mask layer;
    forming a first photoresist over the second mask layer, and forming a first photoresist pattern having a first window and a second window by photolithography in which ArF is used;
    forming a first opening in the second mask layer under the first window and forming a second opening in the second mask layer under the second window, by etching the second mask layer through the first window and the second window;
    forming a third opening in the first mask layer under the first opening and forming a fourth opening in the first mask layer under the second opening, by etching the first mask layer through the first opening and the second opening;
    removing the first photoresist pattern;
    forming a first trench and a second trench in the semiconductor layer under the third opening and the fourth opening by etching the semiconductor layer while using the second mask layer as an etching mask;
    forming a second photoresist, and forming a second photoresist pattern that covers the first trench and has a third window through which the fourth opening is exposed, by photolithography in which KrF is used; and
    etching the second trench to a depth deeper than a depth of the first trench through the fourth opening exposed through the third window.

20. A method for manufacturing a semiconductor device comprising:
    forming a first mask layer over a semiconductor layer;
    forming a second mask layer over the first mask layer;
    forming a first photoresist pattern having a first window and a second window and containing alicyclic-hydrocarbon-containing polymer, over the second mask layer;
    forming a first opening in the second mask layer under the first window and forming a second opening in the second mask layer under the second window, by etching the second mask layer through the first window and the second window;
    forming a third opening in the first mask layer under the first opening and forming a fourth opening in the first mask layer under the second opening, by etching the first mask layer through the first opening and the second opening;
    removing the first photoresist pattern;
    forming a first trench and a second trench in the semiconductor layer under the third opening and the fourth opening by etching the semiconductor layer while using the second mask layer as an etching mask;
    forming a second photoresist pattern covering the first trench, having a third window through which the fourth opening is exposed, and containing an aromatic ring; and
    etching the second trench to a depth deeper than a depth of the first trench through the fourth opening exposed through the third window.

21. A method for manufacturing a semiconductor device comprising:
    forming a multi-level mask layer, including a silicon layer as an upper layer, having first and second windows over a semiconductor layer by photolithography in which ArF is used;
    forming first and second trenches in the semiconductor layer by etching through the first and second window;
    forming a photoresist pattern for covering the first trench and exposing the second trench; and
    etching the second trench such that the second trench has a depth deeper than that of the first trench.

* * * * *